United States Patent
Chae et al.

(10) Patent No.: US 10,090,450 B2
(45) Date of Patent: Oct. 2, 2018

(54) LIGHT EMITTING DEVICE

(71) Applicant: Seoul Viosys Co., Ltd., Ansan-si (KR)

(72) Inventors: Jong Hyeon Chae, Ansan-si (KR); So Ra Lee, Ansan-si (KR); Kyung Hee Ye, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/942,510

(22) Filed: Mar. 31, 2018

(65) Prior Publication Data

US 2018/0226553 A1   Aug. 9, 2018

Related U.S. Application Data

(63) Continuation of application No. 15/667,599, filed on Aug. 2, 2017, which is a continuation of application No. 15/140,155, filed on Apr. 27, 2016, now Pat. No. 9,768,367, which is a continuation-in-part of application No. PCT/KR2015/008841, filed on Aug. 24, 2015.

(30) Foreign Application Priority Data

Aug. 28, 2014 (KR) .................. 10-2014-0113470
Dec. 30, 2014 (KR) .................. 10-2014-0194260
Aug. 19, 2015 (KR) .................. 10-2015-0116740

(51) Int. Cl.
*H01L 33/36* (2010.01)
*H01L 33/62* (2010.01)

(52) U.S. Cl.
CPC .............. *H01L 33/62* (2013.01); *H01L 33/36* (2013.01)

(58) Field of Classification Search
CPC ................................ H01L 33/36; H01L 33/62
USPC .......................................................... 257/99
See application file for complete search history.

(56) References Cited

U.S. PATENT DOCUMENTS

| 6,486,499 B1 | 11/2002 | Krames et al. |
| 9,728,698 B2 * | 8/2017 | Lee .................. H01L 33/647 |
| 2013/0214308 A1 | 8/2013 | Lee et al. |
| 2017/0012176 A1 | 1/2017 | Chae et al. |

FOREIGN PATENT DOCUMENTS

| JP | 2001203386 | 7/2001 |
| KR | 20070001350 | 1/2007 |
| KR | 10-2013-0030178 | 3/2013 |
| KR | 10-2014-0031601 | 3/2014 |

OTHER PUBLICATIONS

International Search Report in International Application No. PCT/KR2015/008841, dated Nov. 27, 2015.

* cited by examiner

*Primary Examiner* — Monica D Harrison
(74) *Attorney, Agent, or Firm* — Perkins Coie LLP

(57) ABSTRACT

A light emitting device in which a bonding pad is soldered to a mounting substrate, wherein the bonding pad may be formed in various shapes that can minimize the occurrence of voids during soldering or heat fusion.

41 Claims, 28 Drawing Sheets

LIGHT EMITTING DEVICE

CROSS-REFERENCE TO RELATED APPLICATIONS

This application is a Continuation of co-pending U.S. application Ser. No. 15/667,599, filed on Aug. 2, 2017, which is a Continuation of U.S. application Ser. No. 15/140,155, filed on Apr. 27, 2016, now U.S. Pat. No. 9,768,367, which is a Continuation-in-part of International Patent Application No. PCT/KR2015/008841, filed on Aug. 24, 2015, and claims priorities from and the benefits of (1) Korean Patent Application No. 10-2014-0113470, filed on Aug. 28, 2014, (2) Korean Patent Application No. 10-2014-0194260, filed on Dec. 30, 2014, and (3) Korean Patent Application No. 10-2015-0116740, filed on Aug. 19, 2015, each of which is incorporated by reference for all purposes as if fully set forth herein.

BACKGROUND

Field

Exemplary embodiments of the invention relate to a light emitting device, and, more particularly, to a light emitting device including a bonding pad soldered to a mounting substrate and having a particular structure capable of minimizing occurrence of voids during soldering.

Discussion of the Background

A high output light emitting device can be obtained by taking into account various design factors such as improvement in luminous efficacy, reduction in package size, and/or reduction in thermal resistance. A flip-chip type light emitting device is one type of the high output light emitting device having such features that is widely used in the art.

Flip-chip bonding means a chip bonding method that utilizes solder bumps to reduce bonding inductance to ¹⁄₁₀ or less. Since substantially no bonding length may exist in the flip-chip bonding, as compared to a conventional wire bonding, such chip packages may be integrated to a higher degree.

To achieve the foregoing design objectives, a flip-chip type light emitting device may be configured to emit light through a substrate in order to reduce light loss in electrode pads. The flip-chip type light emitting device may also include a reflective layer on a p-type semiconductor layer in order to improve extraction efficiency by changing a course of photons traveling towards a mounting substrate into an opposite direction. Further, the flip-chip type light emitting device may have an improved current spreading efficiency, which enables application of low forward voltage.

In addition, although a high output light emitting device typically generates large amounts of heat upon application of high injection current, distance from an active layer corresponding to a heat generation region to a heat dissipation structure in the light emitting device is short, thereby enabling easy heat dissipation and significant reduction in thermal resistance. Accordingly, most high output light emitting devices such as large light emitting devices are of the flip-chip type design.

Various structures have been used for assisting current spreading in a large light emitting device that may utilize a flip-chip bonding. For example, an active layer interposed between a first conductive type semiconductor layer and a second conductive type semiconductor layer may be divided into two or more sections, such that the two or more active layers share one first conductive semiconductor layer.

In flip-chip bonding, a solder bump is melted by application of a heat thereto to realize electrical connection between a bonding pad of a chip and a mounting substrate, and a process of melting the solder bump may be referred to as a reflow process.

In the reflow process, a flux is evaporated and may generate bubbles, which in turn are trapped into the molten solder that generates voids during solidification of the molten solder. Voids act as a main factor that weakens heat dissipation and causes a connection failure between the bonding pad of the chip and the mounting substrate, thereby deteriorating reliability of a light emitting device.

Therefore, there is a need in the art to minimize the occurrence of voids in order to improve reliability of light emitting devices, particularly high output light emitting devices such as flip-chip types light emitting devices.

The above information disclosed in this Background section is only for enhancement of understanding of the context of the inventive concept, and, therefore, may contain information that does not form the prior art that is already known in this country to a person of ordinary skill in the art.

SUMMARY

The invention meets the aforementioned need in light emitting devices by providing a bonding pad or similar structure, which is soldered or heat fused to a mounting substrate and has a particular structure capable of minimizing the occurrence of voids during soldering or other heat fusing or connection process.

Exemplary embodiments of the present disclosure may also provide a light emitting device capable of minimizing occurrence of defects during soldering or fusing.

Exemplary embodiments of the invention may further provide a high efficiency light emitting device that generates uniform light over a wide area of an active layer through uniform current spreading, thereby improving luminous efficacy, and a light emitting, module including the same.

Exemplary embodiments of the invention provide a light emitting device and a light emitting module that may prevent current crowding at corners thereof.

Exemplary embodiments of the invention also provide a flip-chip type light emitting device and a light emitting module that may reduce loss of light generated in an active layer.

More particularly, according to one exemplary embodiment, a light emitting device includes a first bonding pad configured to be soldered to a mounting substrate, a first electrode electrically connected to the first bonding pad via a first connection electrode, a first conductive type semiconductor layer connected to the first electrode, and a solder ball contactable region and a non-conductive region, in which the first bonding pad includes at least two elongate, opposed regions disposed in the solder ball contactable region, and the non-conductive region is disposed between the at least two elongate, opposed regions.

According to one exemplary embodiment, a light emitting device includes a first bonding pad configured to be soldered to a mounting substrate, a first electrode electrically connected to the first bonding pad via a first connection electrode, and a first conductive type semiconductor layer connected to the first electrode, in which the first bonding pad is disposed in a portion of a solder ball contactable region, and a non-conductive pattern is disposed in the remaining portion of the solder ball contactable region, through which by-products generated during soldering escape.

Other features may be used in particular exemplary embodiments of the invention. For example, the mesa may have rounded corners, thereby preventing current crowding at the corners thereof.

The second electrode pad may include a plurality of fingers. Since the second electrode pad has the plurality of fingers, the light emitting device may have improved bonding strength by preventing voids from being trapped in the electrode pads upon flip-chip bonding of the light emitting device to a submount or a printed circuit board.

The first electrode pad may also include a plurality of fingers. The fingers of the first electrode pad and the fingers of the second electrode pad may be arranged to oppose each other and be alternately arranged. Accordingly, the fingers may be formed to have a longer length, thereby assisting in current spreading.

In some exemplary embodiments, the exterior contact portion may have a ring shape surrounding the mesa. Alternatively, the first contact layer may include a plurality of exterior contact portions separated from each other. The plurality of exterior contact portions may be separated from each other near the corners of the mesa. In this manner, the light emitting device may farther prevent current crowding near the corners of the mesa.

The interior contact portions may include elongated contact portions. In this manner, the light emitting device may facilitate current spreading in the first conductive type semiconductor layer.

The light emitting device may further include an upper insulation layer disposed on the first contact layer and having a first opening overlapping the first contact layer and a second opening overlapping the second contact layer. The first electrode pad and the second electrode pad may be electrically connected to the first contact layer and the second contact layer through the first and second openings of the upper insulation layer, respectively. The upper insulation layer may cover the first contact layer to protect the first contact layer.

The light emitting device may further include an intermediate connection layer disposed between the second contact layer and the second electrode pad, and surrounded by the first contact layer. The second opening of the upper insulation layer may expose the intermediate connection layer, the second electrode pad may be connected to the intermediate connection layer through the second opening of the upper insulation layer, and the intermediate connection layer may be connected to the second contact layer.

The first contact layer and the intermediate connection layer may include an Al layer as the same material layer and a Ti uppermost layer. The Al layer may be used as a reflective layer and the Ti uppermost layer may reinforce bonding strength with the upper insulation layer disposed thereon.

The Ti uppermost layer may be substantially disposed between an interface between the first contact layer and the upper insulation layer, and an interface between the intermediate connection layer and the upper insulation layer.

The second electrode pad may be substantially disposed on the intermediate connection layer to have a narrower area than the intermediate connection layer.

The light emitting device may further include a lower insulation layer covering the mesa to insulate the first contact layer from the mesa and interposed between the second contact layer and the intermediate connection layer.

The lower insulation layer may expose the first conductive type semiconductor layer such that the exterior contact portion and the interior contact portions contact the first conductive type semiconductor layer, and expose the second contact layer such that the intermediate connection layer is connected to the second contact layer.

The lower insulation layer may include a silicon nitride layer and a silicon oxide layer, and the upper insulation layer may include a silicon oxide layer.

The light emitting device may further include a substrate on which the first conductive type semiconductor layer is disposed, and may further include a wavelength conversion layer covering a lower surface and a side surface of the substrate.

In accordance with a further exemplary embodiment, a light emitting module may include a submount mounted on a printed circuit board, and the light emitting device as set forth above, the light emitting device being flip-bonded to the submount.

It is to be understood that both the foregoing general description and the following detailed description are exemplary and explanatory and are intended to provide further explanation of the subject matter of invention, which is defined solely by the appended claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
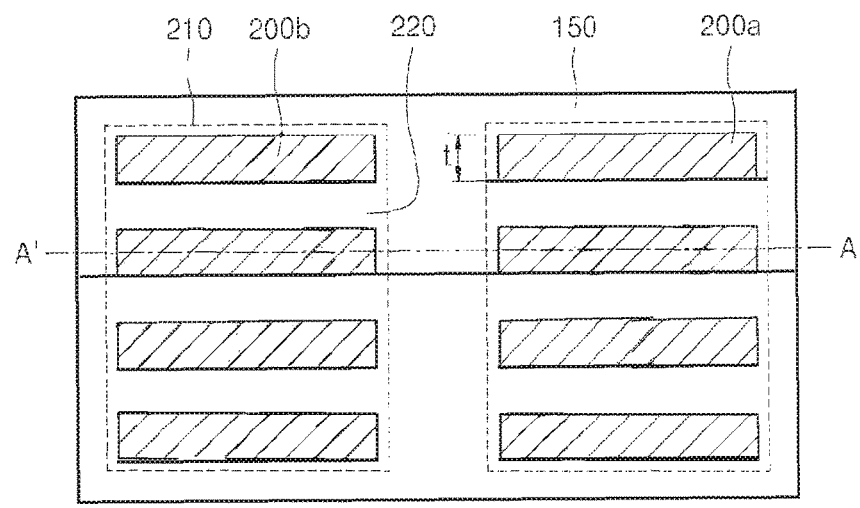
FIG. 1A is a plan view of a light emitting device including a bonding pad constructed, according to the principles of the invention having bonding pads or electrodes with particular spaced structures according to some exemplary embodiments of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiment. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Figure 1B:
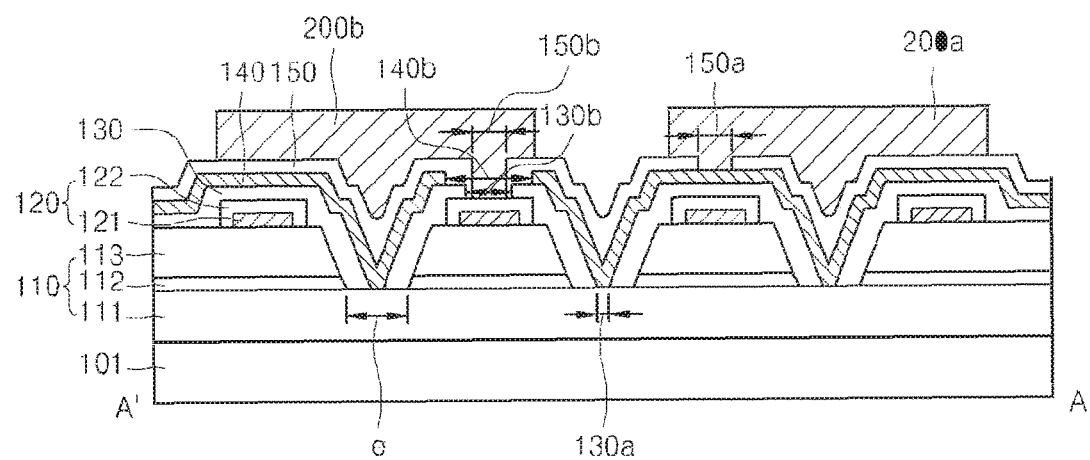
FIG. 1B is a cross-sectional view of the light emitting device taken along line A'-A of FIG. 1A.

FIG. 1A is a plan view of a light emitting device including a bonding pad constructed having a particular structure according to one exemplary embodiment of the invention. FIG. 1B is a cross-sectional view of the light emitting device taken along line A'-A of FIG. 1A.

Referring to FIGS. 1A and 1B, a light emitting device according to the exemplary embodiment includes electrodes having a particular structure in which a first conductive type semiconductor layer 111, an active layer 112, and a second conductive type semiconductor layer 113 are formed on a substrate 101 such that the active layer 112 is interposed between an n-type semiconductor layer 111 and a p-type semiconductor layer 113.

The substrate 101 may be formed using a typical material, such as aluminum oxide ($Al_2O_3$), silicon carbide (SiC), silicon (Si), gallium arsenide (GaAs), gallium nitride (GaN), zinc oxide (ZnO), gallium phosphide (GaP), indium phosphide (InP), and germanium (Ge), known in the art. A roughness pattern may be formed on upper and/or lower surfaces of the substrate 101. The roughness pattern may have a shape selected from among a stripe shape, a lens shape, a column shape, a conical shape, and the like.

The first conductive type semiconductor layer 111 includes a semiconductor layer doped with a first conductive type dopant. The first conductive type semiconductor layer 111 may include at least one of gallium nitride (GaN), indium nitride (InN), aluminum nitride (AlN), indium gallium nitride (InGaN), aluminum gallium nitride (AlGaN), and indium aluminum gallium nitride (InAlGaN). The first conductive type semiconductor layer 111 may be an n-type semiconductor layer, the first conductive type dopant may include at least one n-type dopant, such as selected from among Si, Ge, Sn, Se, and Te.

The active layer 112 may have a single quantum well structure or a multi-quantum well (MQW) structure. More particularly, the active layer may be formed of a group III-group V compound semiconductor, that is, at least one of GaN, InN, AlN, InGaN, AlGaN, and InAlGaN. For example, the active layer 112 may have a structure, in which InGaN well layers and GaN barrier layers are alternately stacked one above another. The active layer 112 may generate light through recombination of carriers supplied from the first conductive type semiconductor layer 111 and carriers supplied from the second conductive type semiconductor layer 113. When the first conductive type semiconductor layer 111 is an n-type semiconductor layer, the carriers supplied from the first conductive type semiconductor layer 111 may be electrons, and when the second conductive type semiconductor layer 113 is a p-type semiconductor layer, the carriers supplied from the second conductive type semiconductor layer 113 may be holes.

The second conductive type semiconductor layer 113 includes a semiconductor layer doped with a second conductive type dopant, and may be composed of a single layer or multiple layers. The second conductive type semiconductor layer 113 may be formed of at least one of GaN, InN, AlN, InGaN, AlGaN, and InAlGaN. The second conductive type semiconductor layer 113 may be a p-type semiconductor layer, and the second conductive type dopant may include at least one p-type dopant, such as selected from among Mg, Zn, Ca, Sr, and Ba.

The light emitting device according to the exemplary embodiment may further include a non-doped layer or other buffer layers, in order to improve crystal quality. When the second conductive type semiconductor layer 113 is the p-type semiconductor layer, the light emitting device may include layers that may perform various functions, such as an electron blocking layer (not shown) formed between the active layer 112 and the second conductive type semiconductor layer 113.

A nitride-based semiconductor stack 110 may include exposure regions "e" that partially expose the first conductive type semiconductor layer 111, such that the first conductive type semiconductor layer 111 is electrically connected to a first electrode 140 through the exposure regions "e". Current spreading efficiency and light emission patterns of the light emitting device may be adjusted depending upon the location, shape, and number of the exposure regions "e". The exposure regions "e" may be formed by a photolithography and etching technology. For example, the exposure regions "e" may be formed by defining etching regions using a photoresist, and etching the second conductive type semiconductor layer 113 and the active layer 112 by dry etching, such as inductively coupled plasma (ICP) etching.

FIG. 1B shows one example of the exposure regions "e" having a hole shape that is formed through the active layer 112 and the second conductive type semiconductor layer 113. The first conductive type semiconductor layer 111 is electrically connected to the first electrode 140 through the holes. The holes may be arranged regularly or irregularly.

Current spreading efficiency and light emission patterns of the light emitting device may be adjusted depending upon the location, shape, and number of the holes in the exposure regions "e".

A second electrode 120 may be disposed on the second conductive type semiconductor layer 113, and electrically connected to the second conductive type semiconductor layer 113. The second electrode 120 includes a reflective metal layer 121 and may further include a barrier metal layer 122, which may cover an upper surface and side surfaces of the reflective metal layer 121. For example, the barrier metal layer 122 may be formed to cover the upper and side surfaces of the reflective metal layer 121 by forming a pattern of the reflective metal layer 121, followed by forming the barrier metal layer 122 thereon. More particularly, the reflective metal layer 121 may be formed through deposition and patterning of Ag, Ag alloy, Ni/Ag, NiZn/Ag, or TiO/Ag layers.

The barrier metal layer 122 may be formed of Ni, Cr, Ti, Pt, or combinations thereof. The barrier metal layer 122 prevents metallic materials of the reflective metal layer 121 from diffusing or being contaminated. Furthermore, the second electrode 120 may include indium tin oxide (ITO), zinc oxide (ZnO), and the like. ITO or ZnO is a metal oxide having high light transmittance, and thus, may improve luminous efficacy of the light emitting device by suppressing light absorption by the second electrode 120.

The first electrode 140 may be electrically connected to the first conductive type semiconductor layer 111. The first electrode 140 may cover the nitride-based semiconductor stack 110. In addition, the first electrode 140 may include an opening 140b that exposes the second electrode 120. The first electrode 140 may be formed over substantially the entirety of a growth substrate 101, excluding the opening 140b. Accordingly, current may easily spread over substantially the entirety of the growth substrate 101 through the first electrode 140. The first electrode 140 may include a highly reflective metal layer, such as an Al layer, which may be formed on a bonding layer, such as Ti Cr, or Ni layer. The light emitting device may further include a protective layer of Ni, Cu, or Au having a single layer structure or a combination layer thereof on the highly reflective metal layer. The first electrode 140 may have a multilayer structure of, for example, Ti/Al/Ti/Ni/Au. The first electrode 140 may be formed through deposition and patterning of a metallic material on the nitride-based semiconductor stack 110.

The light emitting device according to this exemplary embodiment may further include a lower insulation layer 130. The lower insulation layer 130 covers an upper surface of the nitride-based semiconductor stack 110 and an upper surface and side surfaces of the second electrode 120. The lower insulation layer 130 is interposed between the nitride-based semiconductor stack 110 and the first electrode 140 to insulate the first electrode 140 from the second electrode 120. The lower insulation layer 130 has openings 130a, 130b that may provide electrical connection to the first conductive type semiconductor layer 111 and the second conductive type semiconductor layer 113 in a predetermined region. For example, the lower insulation layer 130 may include the opening 130a that exposes the first conductive type semiconductor layer 111 and the opening 130b that exposes the second electrode 120. The opening 130b of the lower insulation layer 130 may be narrower than the opening 140b of the first electrode 140. The lower insulation layer 130 may include an oxide, such as silicon oxide ($SiO_2$), a nitride, such as silicon nitride ($SiN_x$), or an insulation material, such as magnesium fluoride ($MgF_2$) through chemical vapor deposition (CVD) or the like. The lower insulation layer 130 may have a single layer or multiple layers structure. Furthermore, the lower insulation layer 130 may include a distributed Bragg reflector (DBR), in which low refractivity material layers and high refractivity material layers are alternately stacked one above another. For example, an insulation layer having high reflectivity may be formed by stacking $SiO_2$/$TiO_2$ layers or $SiO_2$/$Nb_2O_5$ layers.

The light emitting device according to this exemplary embodiment may further include an upper insulation layer 150. The upper insulation layer 150 may cover a portion of the first electrode 140. The upper insulation layer 150 may include an opening 150a that exposes the first electrode 140, and an opening 150b that exposes the second electrode 120. The opening 150b of the upper insulation layer 150 may be narrower than the opening 140b of the first electrode 140 and the opening 130b of the lower insulation layer 130. Accordingly, the upper insulation layer 150 may cover not only a sidewall of the opening 140b of the first electrode 140 but also a sidewall of the opening 130b of the lower insulation layer 130 may be covered by the upper insulation layer 150. In this manner, the light emitting device protect the second electrode 120 from infiltration of moisture and the like more effectively. In particular, even when the second electrode 120 does not include the barrier metal layer 122, external moisture may be prevented from infiltrating the reflective metal layer of the second electrode 120 by the upper insulation layer 150. However, it should be understood that the present disclosure is not limited thereto and the upper insulation layer 150 may be alternatively formed through deposition and patterning of an oxide insulation layer, a nitride insulation layer, or a polymer, such as polyimide, Teflon, and Parylene, on the first electrode 140.

A bonding pad of the light emitting device according to the exemplary embodiment may include first bonding pads 200a and second bonding pads 200b electrically connected to the first electrode 140 and the second electrode 120, respectively. Referring to FIG. 1B, each of the first bonding pads 200a may be connected to the first electrode 140 through a first connection electrode formed in the opening 150a of the upper insulation layer 150, and each of the second bonding pads 200b may be connected to the second electrode 120 through a second connection electrode formed in the opening 150b of the upper insulation layer 150. The first bonding pads 200a and the second bonding pads 200b may connect the first electrode 140 and the second electrode 120 to the mount substrate (not shown). The first bonding pads 200a and the second bonding pads 200b may be simultaneously formed by the same process, for example, photolithography and etching technology, or lift-off technology. The first bonding pads 200a and the second bonding pads 200b may include a bonding layer of, for example, Ti, Cr, or Ni, and a highly conductive metal layer of, for example, Al, Cu, Ag, or Au.

In the light emitting device including the bonding pads 200a and 200b according to this exemplary embodiment, the active layer 112 divided into several sections may share a single first conductive type semiconductor layer 111.

When the first bonding pads 200a and the second bonding pads 200b occupy a substantial area of solder ball contactable regions 210 to facilitate bonding between a mounting substrate and the bonding pads 200a and 200b, reliability of the light emitting device may be deteriorated due to the voids generated during the reflow process.

According to an exemplary embodiment of the invention, as shown in FIG. 1 to FIG. 6, the light emitting device including electrodes may have a configuration, in which the bonding pads 200a and 200b are soldered to a mounting substrate (not shown) and are electrically connected to the first conductive type semiconductor layer 111 and the second conductive type semiconductor layer 113 via connection electrodes, respectively. Two or more bonding pads 200a and 200b having a generally rectangular shape (as defined below) are formed in each of the solder ball contactable regions 210. At least two of the bonding pads 200a and 200b oppose each other. A non-conductive region 220 may be disposed between the at least two adjacent bonding pads 200a and 200b.

As used herein, the solder ball contactable region 210 means a portion of the light emitting device that may contact a solder ball disposed on the mounting substrate. When a solder is melted in a reflow process, the solder ball contactable region 210 may be included in a region occupied by the molten solder.

The configuration and constituent elements of the first bonding pad 200a may be substantially similar to those of the second bonding pad 200b. As such, the bonding pad according to exemplary embodiments of the invention will be described with reference to the first bonding pad 200a, for convenience of description.

As used herein, the "generally rectangular" or "rectangular" shape of the bonding pad 200a refers to a bonding pad having an elongate shape, length of greater than its width, such as an electrode. The rectangular bonding pad 200a may have at least or more rounded corners. In addition, as used herein, the non-conductive region 220 is a region in which the bonding pads 200a are not formed, and to which the upper insulation layer 150 is exposed. More particularly, the non-conductive region 220 may correspond to regions defined by a step or space between the upper insulation layer 150 and a layer of the bonding pads 200a.

As used herein, the "bonding pads are opposed each other" means any structure, in which the bonding pads 200a and 200b face each other by being disposed generally parallel to each other or facing each other even if not disposed parallel to each other. More particularly, the bonding pads 200a of the light emitting device include two or more generally rectangular bonding pads 200a, in which at least two of the two or more bonding pads 200a are opposed to face each other, and the non-conductive region 220 is disposed between the at least two opposed bonding pad 200a, to reduce the occurrence of voids during the reflow process. More particularly, as shown in FIG. 1A, at least two of the two or more bonding pads 200a may be separated from each other.

Figure 2:
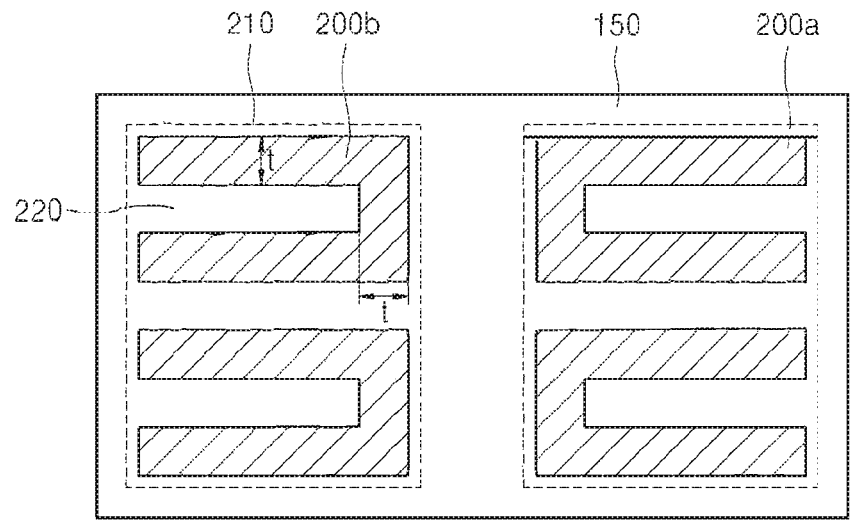
FIG. 2, FIG. 3, FIG. 4, FIG. 5, FIG. 6, and FIG. 8 are plan views of light emitting devices including electrodes having various shapes, according to exemplary embodiments of the invention.

Referring to FIG. 2, at least two of the two or more line-shaped bonding pads 200a may be connected to each other.

Referring to FIGS. 3 to 6, the rectangular bonding pads 200a may be connected to each other at any location via a connection portion to form various shapes such as "E", "W", and "H" or other shapes. For example, referring to FIG. 3, all of four bonding pads 200a are connected to each other through three connection portions. More particularly, as shown in FIG. 3 to FIG. 6, when the number of two or more bonding pads 200a is n (n≥2), and the light emitting device includes at least n−1 connection portions, all of the rectangular bonding pads 200a may be connected to each other so as to extend from a common base or connection point.

According to an exemplary embodiment of the invention, the bonding pads 200a may be alternatively connected to each other via a greater number of connection portions, so long as the non-conductive region 220 is disposed between two opposed bonding pads 200a.

More particularly, the bonding pad 200a of the light emitting device includes two or more bonding pads 200a, in which at least two of the line-shaped bonding pads 200a are generally opposed to each other, and the non-conductive region 220 is disposed between the two opposed bonding pads 200a. In this manner, an upper portion of the insulation pads 150 is exposed, and provides a space defined by the step between the insulation layer 150 and the layer of the bonding pads 200a, which may reduce the occurrence of large voids during a reflow process.

Figure 3:
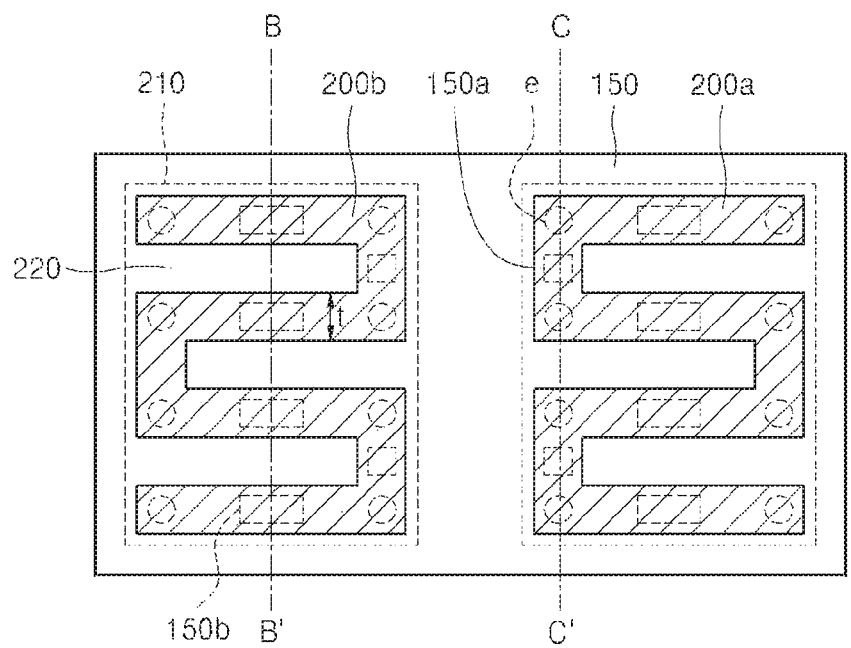
Figure 4:
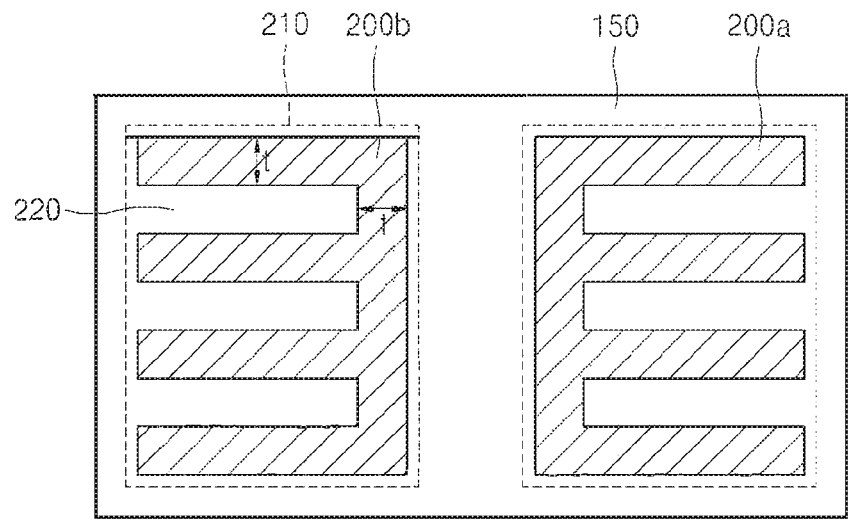
Figure 5:
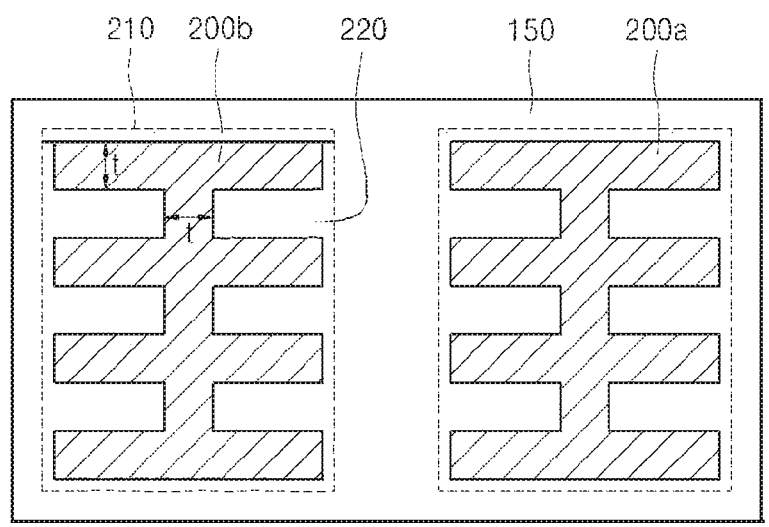
Figure 6:
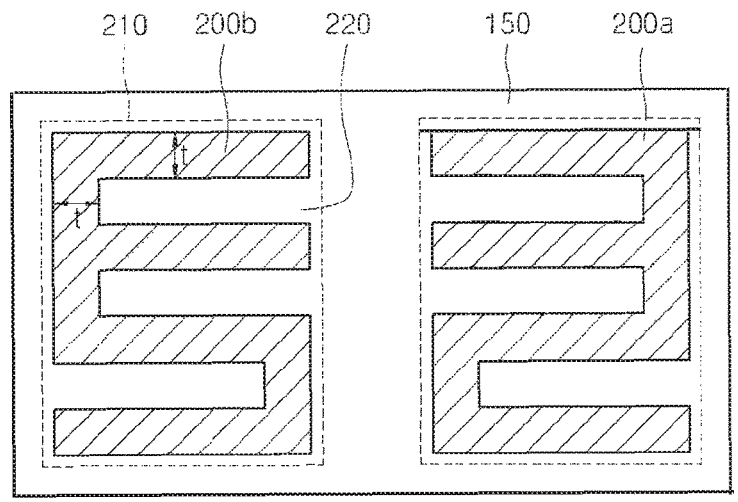
Figure 7A:
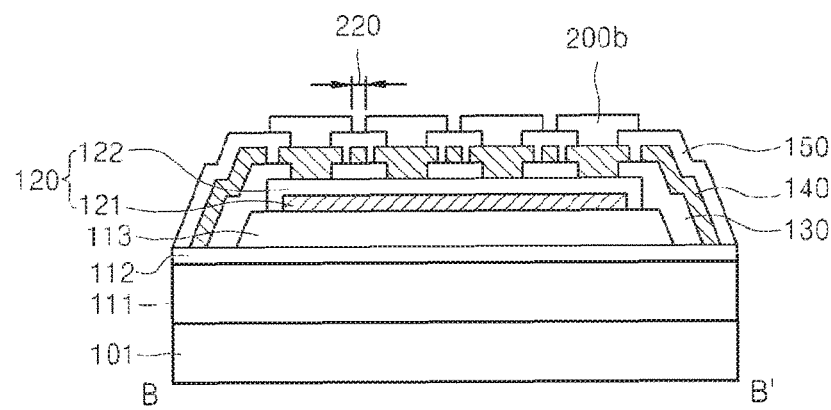
FIG. 7A is a cross-sectional view of the light emitting device taken along line B-B' of FIG. 3.
Figure 7B:
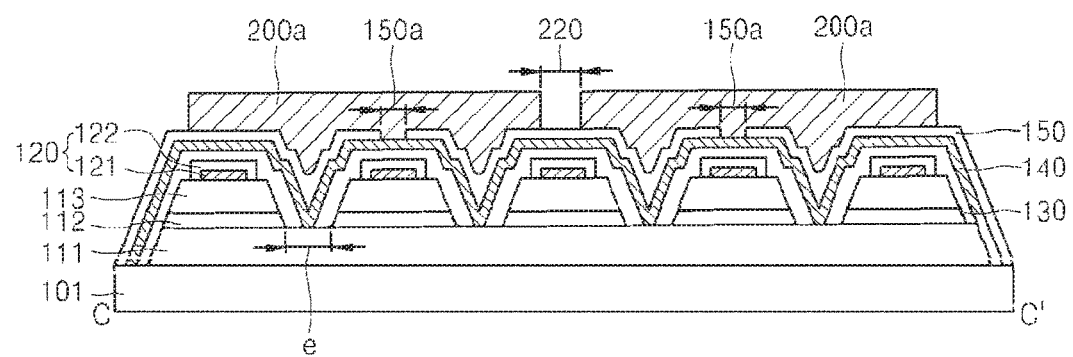
FIG. 7B is a cross-sectional view of the light emitting device taken along line C-C' of FIG. 3.

FIGS. 7A and 7B are cross-sectional views of the light emitting device taken along lines B-B' and C-C' of FIG. 3.

Referring to FIG. 7A, the second bonding pads 200b are generally rectangular bonding pads 200b and the non-conductive region 220 is interposed between the opposed bonding pads 200b. In this manner, a space defined by a step between the insulation layer 150 and a layer of the bonding pad 200b is formed therebetween, such that by-products, such as any unwanted substances generated during soldering or fusing in a state of gas, liquid, liquid, etc., generated during the reflow process may escape into the space, thereby improving reliability of the light emitting device.

Referring to FIG. 7B, the first bonding pads 200a are generally rectangular bonding pads 200a and the non-conductive region 220 is interposed between the opposed bonding pads 200a. In this manner, a space defined by the step between the insulation layer 150 and the layer of the bonding pad 200a is formed therebetween, such that voids generated during the reflow process may escape into the space, thereby improving reliability of the light emitting device.

The line-shaped bonding pads 200a may have a width "t" of 200 μm or less. When the width "t" of the bonding pads 200a may be less is greater than 200 μm, a distance from a location where voids are generated in the solder ball contactable region 210 to the non-conductive region 220 becomes too long within the bonding pad 200a. Accordingly, the voids may be trapped in the bonding pads 200a, rather than escaping from the bonding pads 200a, which may deteriorate reliability of the light emitting device, such as poor connection to the mounting substrate, deterioration in heat dissipation, and the like.

In addition, the line-shaped bonding pads 200a may have a width "t" of 40 μm or more. When the width "t" of the line-shaped bonding pads 200a is less than 40 μm, current injection into the bonding pads 200a may be lowered, which may deteriorate luminous efficacy of the light emitting device.

The ratio of the area of the bonding pads 200a to the area of the solder ball contactable regions 210 may be 40% or more. When the area of the line-shaped bonding pads 200a is less than 40% of the area of the solder ball contactable regions 210, current injection into the bonding pads 200a may be lowered, which may deteriorate luminous efficacy of the light emitting device. It is contemplated that the structure of the bonding pad according to exemplary embodiments of the invention may be modified in various ways to prevent the occurrence of voids having a larger diameter than the width of electrodes.

Figure 8:
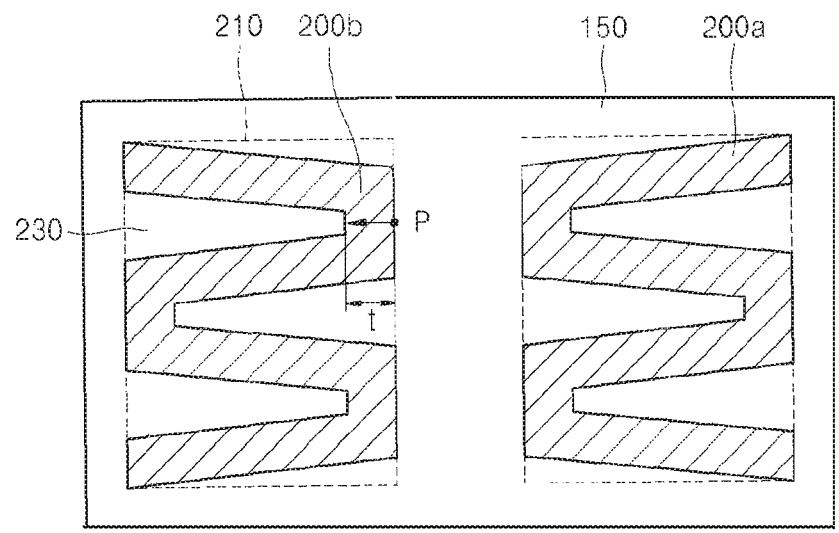

Referring to FIG. 8, in a light emitting device including electrodes according to an exemplary embodiment of the invention, bonding pads 200a and 200b are soldered to a mounting substrate, and are electrically connected to the first electrode 140 and the second electrode 120 connected to the first conductive type semiconductor layer and the second conductive type semiconductor layer via the connection electrodes, respectively. The bonding pads 200a is disposed on a portion of a solder ball contactable region 210, and a non-conductive pattern 230, which may provide a path for void to escape, is formed in the remaining portion of the solder ball contactable region 210.

As used herein, the non-conductive pattern 230 may correspond to a region in which the bonding pads 200a and 200b are not formed, and to which the upper insulation layer 150 is exposed. In this manner, a space between the upper insulation layer 150 and a layer of the bonding pads 200a and 200b may be formed, such that voids generated during the reflow process may escape into the space formed thereby.

In particular, in the light emitting device according to the exemplary embodiment, the bonding pads 200a and 200b are formed in a portion of the solder ball contactable region 210, and the non-conductive pattern 230 is formed in the remaining portion of the solder ball contactable region 210, such that voids may escape through the non-conductive pattern 230, which may reduce the occurrence of voids during the reflow process.

More particularly, as shown in FIG. 8, the non-conductive pattern 230 may be formed within a distance of 200 μm from a point P within the bonding pads 200a and 200b, towards a periphery of the solder ball contactable region 210. In this manner, voids may escape from the bonding pads 200b through the non-conductive pattern 230. In particular, if the distance from the point P within the electrode exceeds about 200 μm, it may be difficult for voids to escape from the bonding pads 200b. Accordingly, the non-conductive pattern 230 may be formed in the other portion of the solder ball contactable region 210.

The non-conductive pattern 230 may have a tapered shape such as trapezoidal that gradually widens towards the periphery of the solder ball contactable region 210. In this manner, the voids may easily escape from the bonding pads 200b.

The ratio of the area of the bonding pads 200a and 200b to an area of the solder ball contactable regions 210 may be 40% or more. If the area of the bonding pads 200a and 200b is less than 40% of the area of the solder ball contactable regions 210, current injection into the electrodes may be lowered, which may deteriorate luminous efficacy of the light emitting device.

Figure 9:
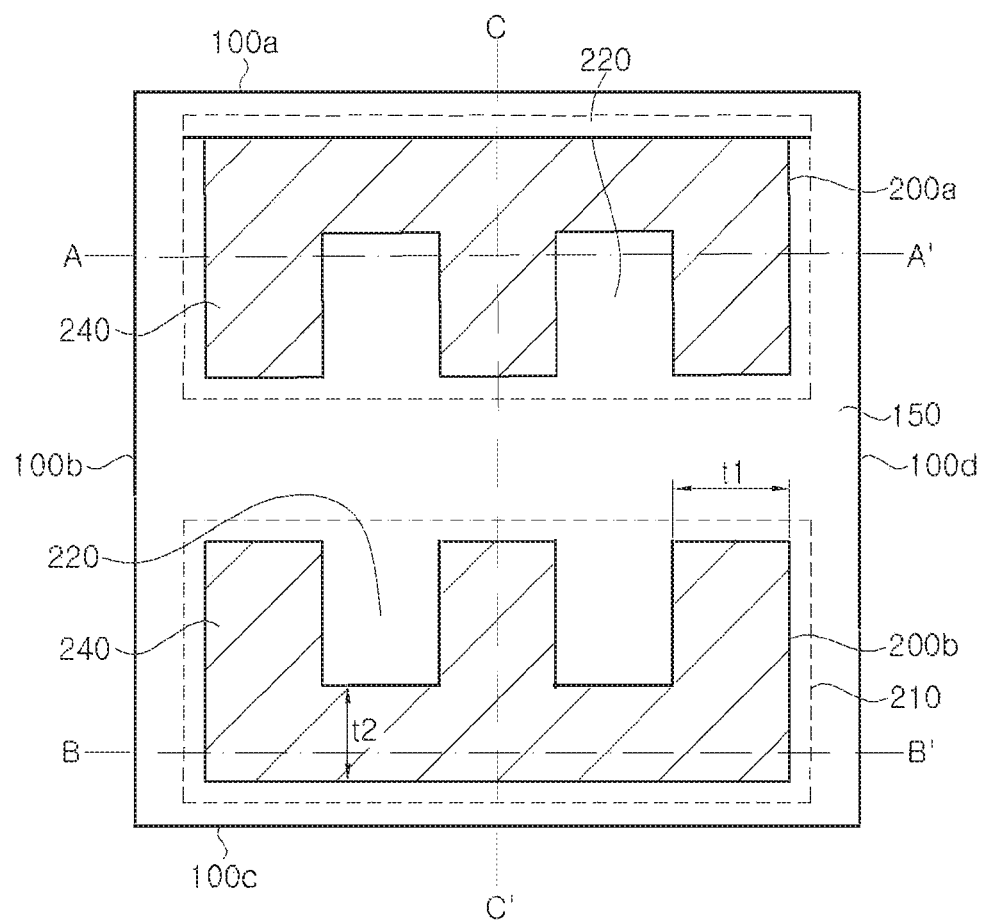
FIG. 9, FIG. 10, FIG. 11, FIG. 12, FIG. 13, and FIG. 14 are plan views and sectional views of a light emitting device, according to other exemplary embodiment of the invention.
Figure 10:
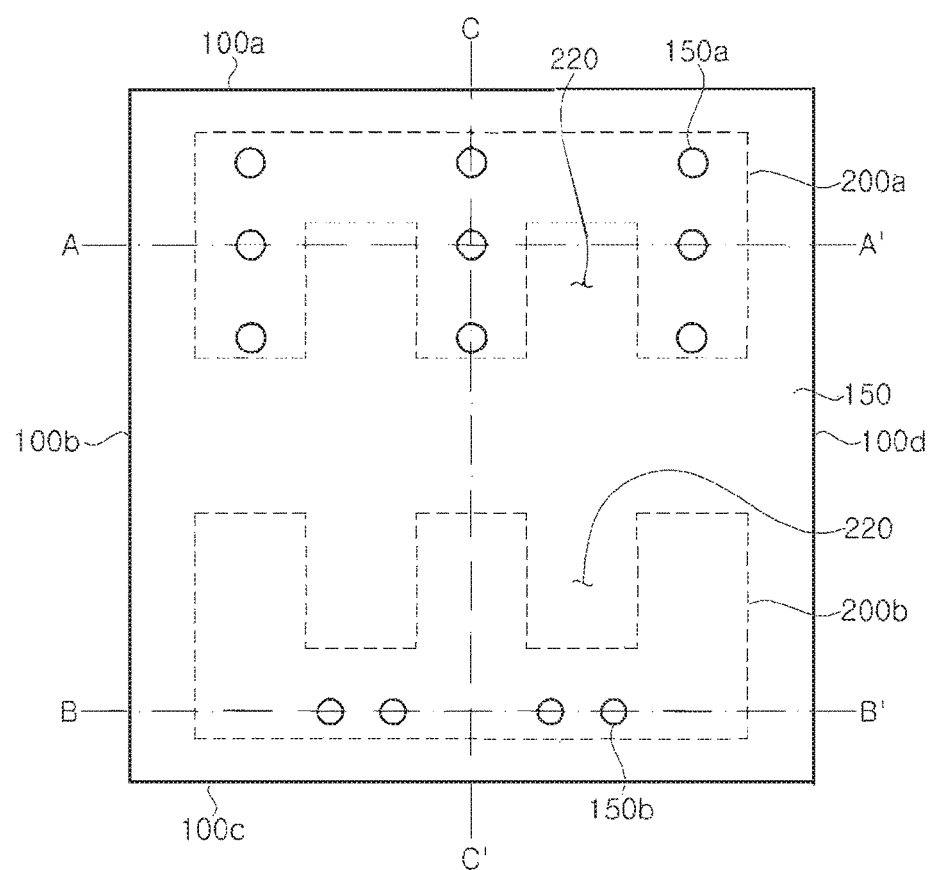
Figure 11:
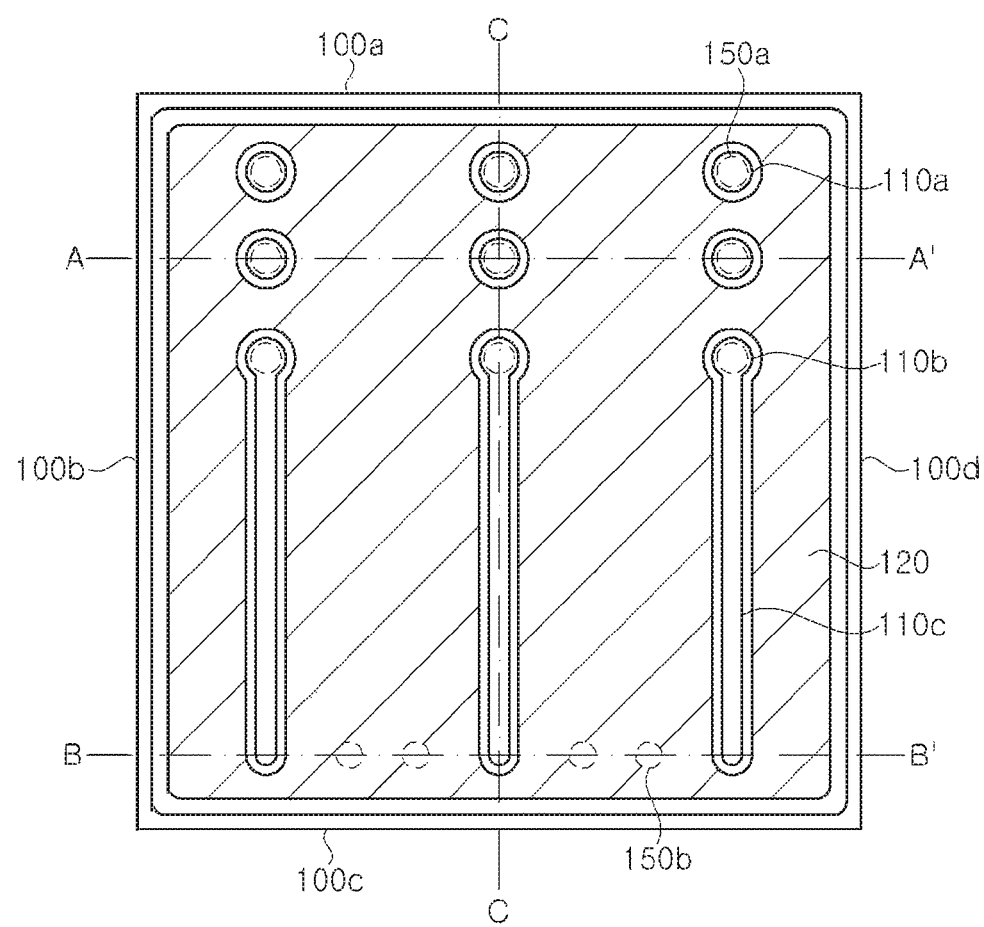
Figure 12:
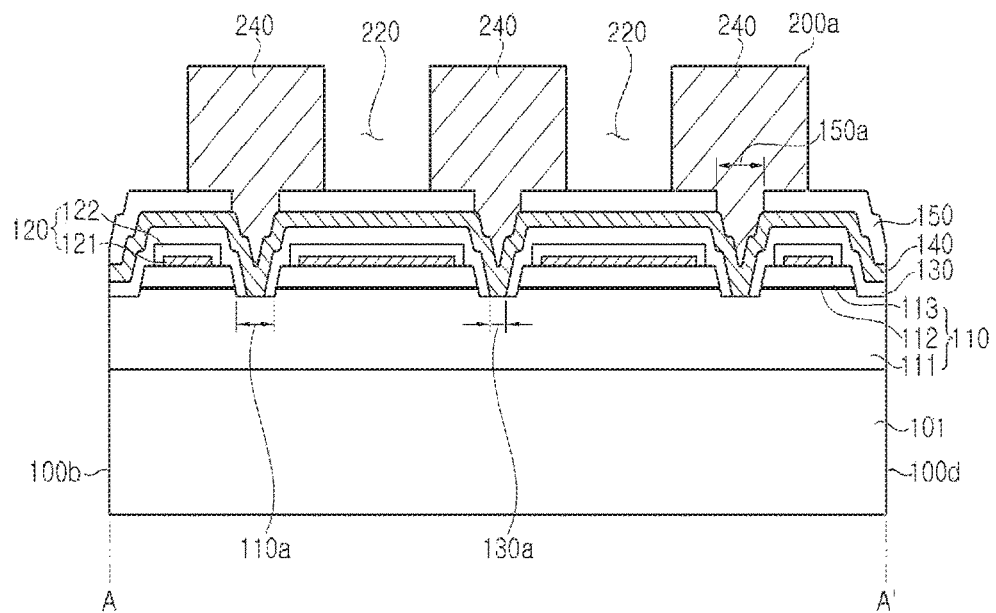
Figure 13:
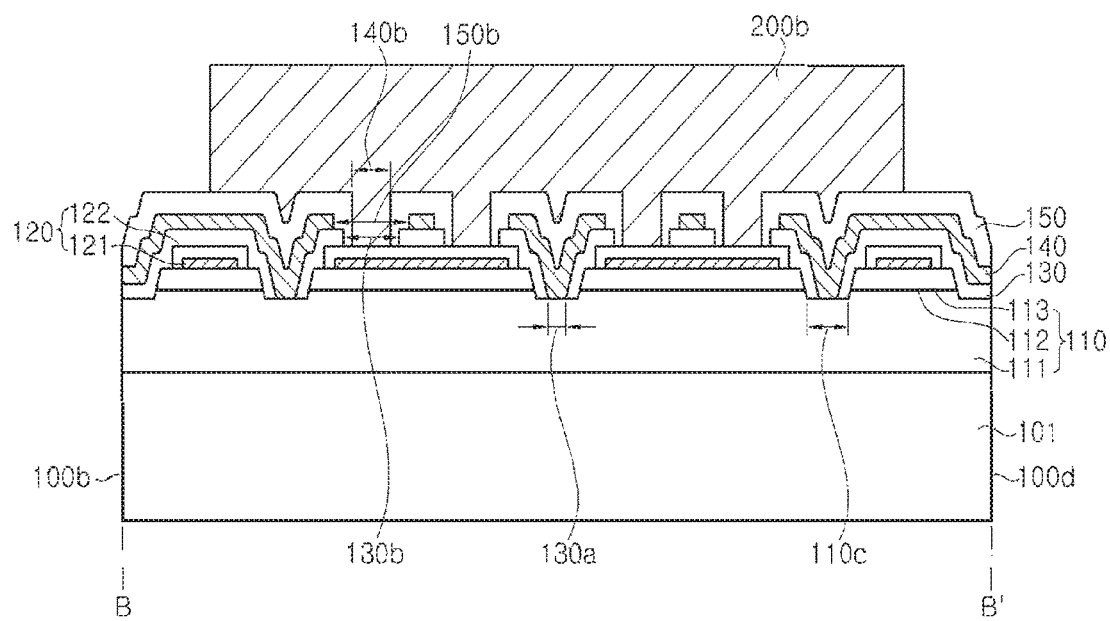
Figure 14:
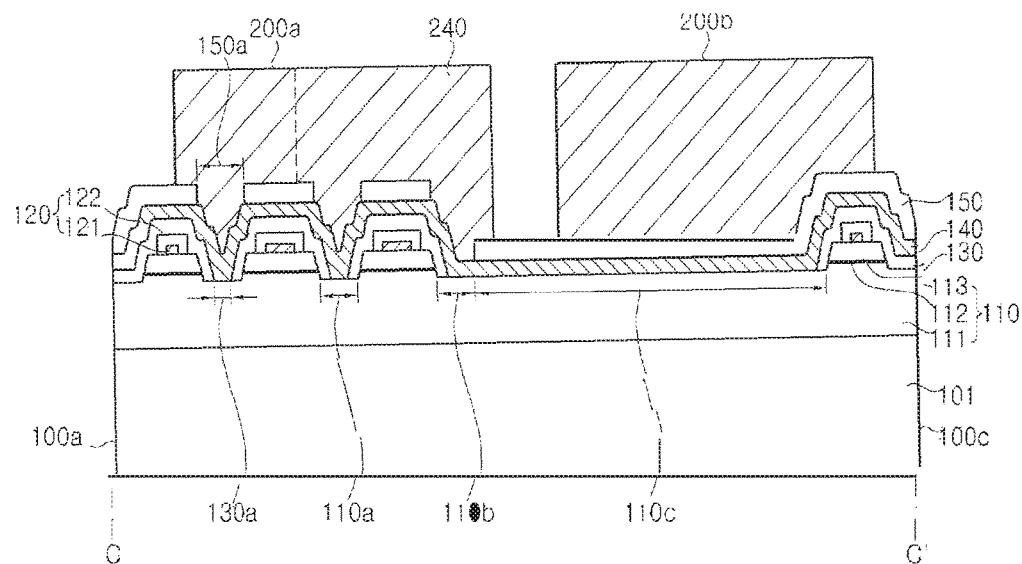

FIG. 9 to FIG. 14 are plan views and sectional views of a light emitting device according to an exemplary embodiment of the invention. In particular, FIG. 9 is a plan view of the light emitting device according to an exemplary embodiment of the invention. FIG. 10 is a plan view of the light emitting device, in which bonding pads 200a and 200b are omitted for convenience of description. FIG. 11 is a plan view of the light emitting device, in which the bonding pads 200a and 200b, an upper insulation layer 150, a first electrode 140 and a lower insulation layer 130 are omitted for convenience of description. FIG. 12 is a cross-sectional view taken along line A-A' of FIG. 9 to FIG. 11. FIG. 13 is a cross-sectional view taken along line B-B' of FIG. 9 to FIG. 11. FIG. 14 is a cross-sectional view taken along line C-C' of FIG. 9 to FIG. 11.

The light emitting device according to the exemplary embodiment has different structures of bonding pads 200a and 200b, and a nitride-based semiconductor stack 110, as compared to those of the light emitting devices illustrated with reference to FIG. 1 to FIG. 8. Repeated description of substantially similar elements of the light emitting device will be omitted.

Referring to FIG. 9 to FIG. 14, the light emitting device according to the exemplary embodiment includes a nitride-based semiconductor stack 110, a first electrode 140, a second electrode 120, a first bonding pad 200a, and a second bonding pad 200b. The light emitting device may further include a lower insulation layer 130, an upper insulation layer 150, and a substrate 101. The light emitting device may have a rectangular planar shape. In the exemplary embodiment, the light emitting device have a substantially square planar shape and include a first side surface 100a, a second side surface 100b, a third side surface 100c opposite to the first side surface 100a, and a fourth side surface 100d opposite to the second side surface 100b.

The nitride-based semiconductor stack 110 includes a first conductive type semiconductor layer 111, an active layer 112 disposed on the first conductive type semiconductor layer 111, and a second conductive type semiconductor layer 113 disposed on the active layer 112. The nitride-based semiconductor stack 110 includes exposure regions 110a, 110b, and 110c that partially expose the first conductive type semiconductor layer 111. Current spreading efficiency and light emission patterns of the light emitting device may be adjusted depending upon the location, shape, and number of the exposure regions 110a, 110b, and 110c.

Referring to FIG. 11, the exposure regions 110a, 110b, and 110c, through which the first conductive type semiconductor layer 111 is partially exposed, may include holes. The holes may include a first hole 110a, a second hole 110b, and a third hole 110c. Each of the first hole 110a, the second hole 110b, and the third hole 110c may be formed in plural. The first holes 110a may generally have a circular or polygonal or irregular shape in plan view. The second holes 110b generally have the same shape as the first holes 110a. The third holes 110c may extend from the second holes 110b in a predetermined direction. The third holes 110c may be connected to the second holes 110b. In addition, the third holes 110c may have a smaller width than the first holes 110a and the second holes 110b.

For example, the first hole 110a may have a circular shape in plan view and are formed in plural. The third hole 110c may extend from e second hole 100b from the first side surface 100a towards the third side surface 100c and are formed in plural. At least a portion of the third holes 110c may extend from a lower portion of the first bonding pad 200a to a lower portion of the second bonding pad 200b.

The second electrode 120 is disposed on the nitride-based semiconductor stack 110, and form ohmic contact with the second conductive type semiconductor layer 113. The second electrode 120 may include openings exposing the first and second holes 110a and 110b, and thus, are separated from the first and second holes 110a and 110b.

The lower insulation layer 130 may cover the nitride-based semiconductor stack 110, and an upper surface and a side surface of the second electrode 120. In the exemplary embodiment, the lower insulation layer 130 may include openings 130a and 130b, which may provide electrical connection to the first conductive type semiconductor layer 111 and the second conductive type semiconductor layer 113 in a predetermined region. For example, the lower insulation layer 130 may include first openings 130a that expose the first conductive type semiconductor layer 111, and a second openings 130b that expose the second electrode 120.

The first electrode 140 may be electrically connected to the first conductive type semiconductor layer 111, and more particularly, form ohmic contact with the first conductive type semiconductor layer 111. The first electrode 140 may be electrically connected to the first conductive type semiconductor layer 111 through the first and second holes 110a and 110b. In this manner, the current injection to the nitride-based semiconductor stack 110 through the first electrode 140 may be adjusted by the location and shape of the first and second holes 110a and 110b. Further, the first electrode 140 may include an opening 140b that exposes the second electrode 120. The first electrode 140 may be formed substantially over the entirety of a growth substrate 101, excluding the opening 140b.

The upper insulation layer 150 may cover a portion of the first electrode 140. The upper insulation layer 150 may include third openings 150a that expose the first electrode 140, and fourth openings 150b that expose the second electrode 120. The fourth opening 150b of the upper insulation layer 150 may be narrower than the openings 140b of the first electrode 140 and the openings 130b of the lower insulation layer 130. In the exemplary embodiment, the upper insulation layer 150 covers a portion of the first electrode 140 disposed in the third hole 110c. In this manner, the third openings 150a of the upper insulation layer 150 may partially expose the first electrode 140 disposed on the first holes 110a and/or the second holes 110b.

The first bonding pad 200a and the second bonding pad 200b may be electrically connected to the first electrode 140 and the second electrode 120, respectively. Referring to FIG. 10, the first bonding pad 200a may contact the first electrode 140 through the third openings 150a, and the second bonding pad 200b may contact the second electrode 150 through the fourth openings 150b.

The first and second bonding pads 200a and 200b include a non-conductive region 220 disposed within a solder ball contactable region 210. Each of the first and second bonding pads 200a and 200b may include a portion disposed generally parallel to one side surface of the light emitting device, and at least one protrusion 240 protruding from the portion. For example, referring back to FIG. 9, the first bonding pad 200a may include a portion disposed generally parallel to the first side surface 100a of the light emitting device, and three protrusions 240 protruding from the portion. The non-conductive region 220 of the first bonding pad 200a may be disposed between the three protrusions 240. Similarly, the second bonding pad 200b may include a portion disposed generally parallel to the third side surface 100c of the light emitting device, and three protrusions 240 protruding from the portion. The non-conductive region 220 of the first bonding pad 200b may be disposed between the three protrusions 240. In this manner, the light emitting device including the non-conductive regions 220 may reduce or prevent the occurrence of voids during soldering.

Width t2 of the portion of each of the first and second bonding pads 200a and 200b, which are disposed generally parallel to one side surface of the light emitting device, may be the same as or different from width t1 of the protrusions 240. The widths t1 and t2 may be in the range from 40 μm to 200 μm.

The first bonding pad 200a may partially cover a portion of the first electrode 140 that contacts the first conductive type semiconductor layer 111, through the exposure regions 110a, 110b, and 110c. More particularly, the first bonding pad 200a may be formed to cover portions of the first electrode 140 disposed in the first holes 110a and the second holes 110b, which have relatively large widths. For example, the protrusions 240 of the first bonding pad 200a may be disposed corresponding to locations of the first holes 110a and the second holes 110b.

Due to heat or stress during soldering or other heat fusion process, stress and strain may be applied to an interface between the first conductive type semiconductor layer 111 and the first electrode 140 through the exposure regions 110a, 110b, and 110c, by which the first conductive type semiconductor layer 111 is exposed. The stress and strain may cause delamination of the first electrode 140 from the first conductive type semiconductor layer 111, which may increase forward voltage (V$_f$) of the light emitting device or inefficient current spreading. As such, reliability of the light emitting device may deteriorate due to electrical and optical properties thereof.

According to the exemplary embodiment, the portions of the first electrode 140 disposed in the first holes 110a and the second holes 110b are covered by the first bonding pad 200a, which may more firmly secure the first electrode 140. In this manner, the light emitting device may prevent delamination of the first electrode 140 from the first conductive type semiconductor layer 111 more efficiently during soldering. In addition, when the first holes 110a and the second holes 110b have greater widths than the third holes 110c, reduction of current injection efficiency through the first holes 110a and the second holes 110b may deteriorate properties of the light emitting device to a greater degree. According to the exemplary embodiment, the portions of the first electrode 140 disposed in the first holes 110a and the second holes 110b are covered by the first bonding pad 200a, which may improve reliability of the light emitting device more effectively.

Figure 15:
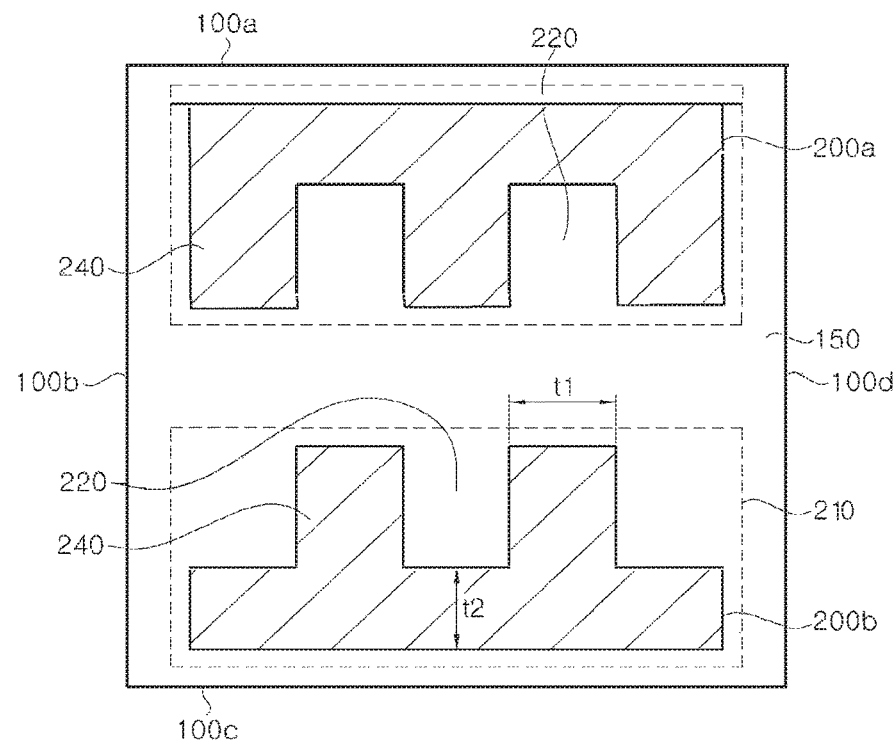
FIG. 15 and FIG. 16 are plan views of a light emitting device, according to a further exemplary embodiment of the invention.
Figure 16:
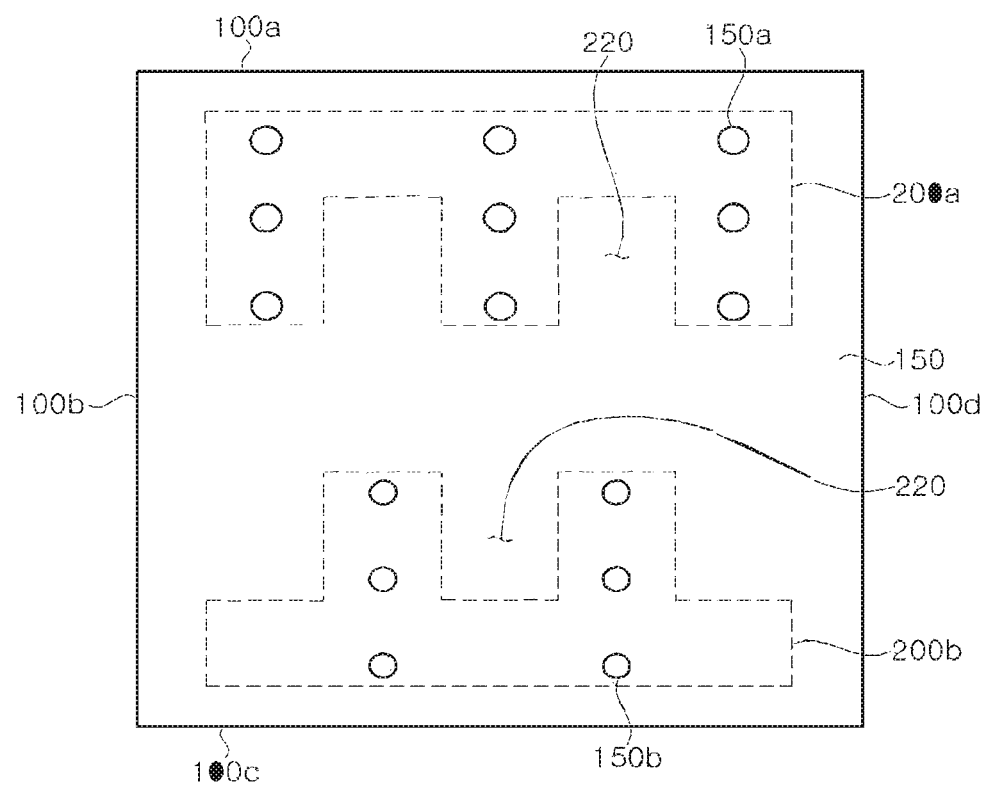

Referring back to FIG. 9 to FIG. 14, the first bonding pad 200a and the second bonding pad 200b may be formed to be generally symmetrical in shape. The protrusions 240 of the first and second bonding pads 200a and 200b, however, may be alternatively modified in various ways. For example, referring to FIG. 15 and FIG. 16, the protrusions 240 of the first bonding pad 200a may be formed to be disposed in the first and second holes 110a and 110b. Accordingly, the first bonding pad 200a may include three protrusions 240 protruding towards the second bonding pad 200b, in which the non-conductive region 220 is disposed between the three protrusions 240. Likewise, the second bonding pad 200b may include three protrusions 240 protruding towards the non-conductive region 220 of the first bonding pad 200a. In this manner, a path for discharging voids in the reflow process may be changed by changing the locations of the protrusions 240.

It is contemplated that a configuration of the first and second bonding pads 200a and 200b, however, may alternatively modified, as illustrated with reference to FIG. 1 to FIG. 8. For example, the first and second bonding pads 200a and 200b may be formed to cover the first holes 110a and the second holes 110b, thereby improving reliability of the light emitting device.

Figure 17:
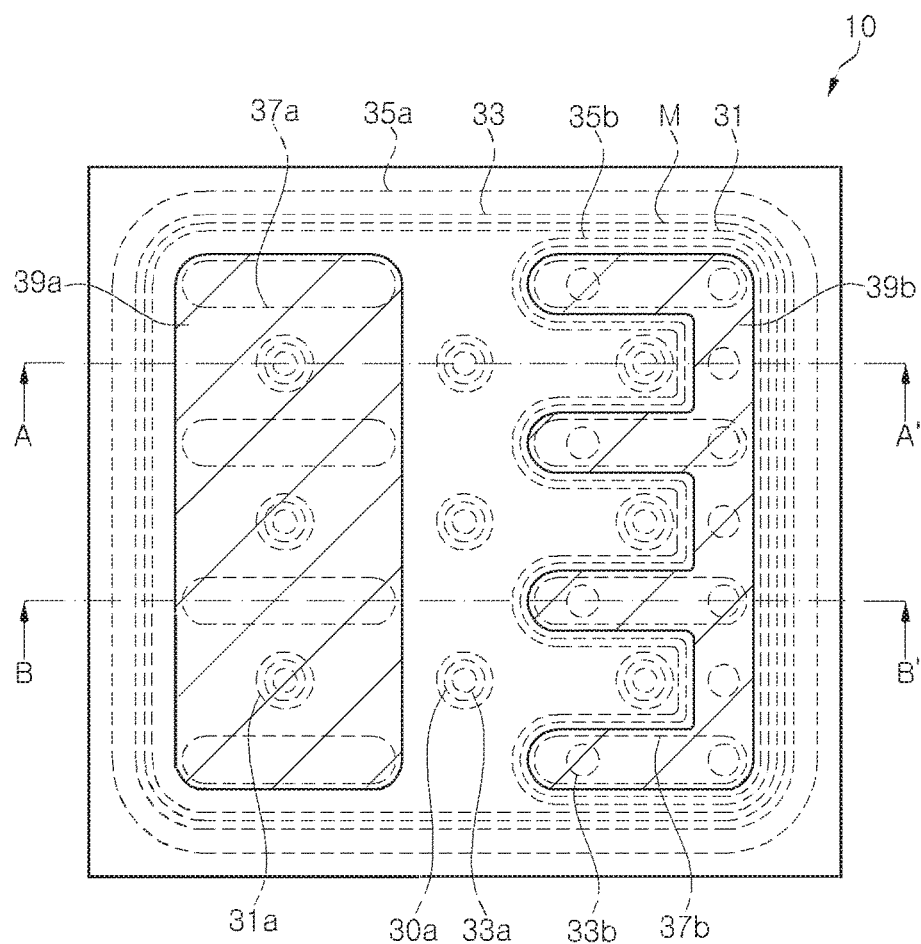
FIG. 17 is a schematic plan view of a light emitting device, according to other exemplary embodiments of the invention having spaced structures to minimize manufacturing defects.
Figure 18:
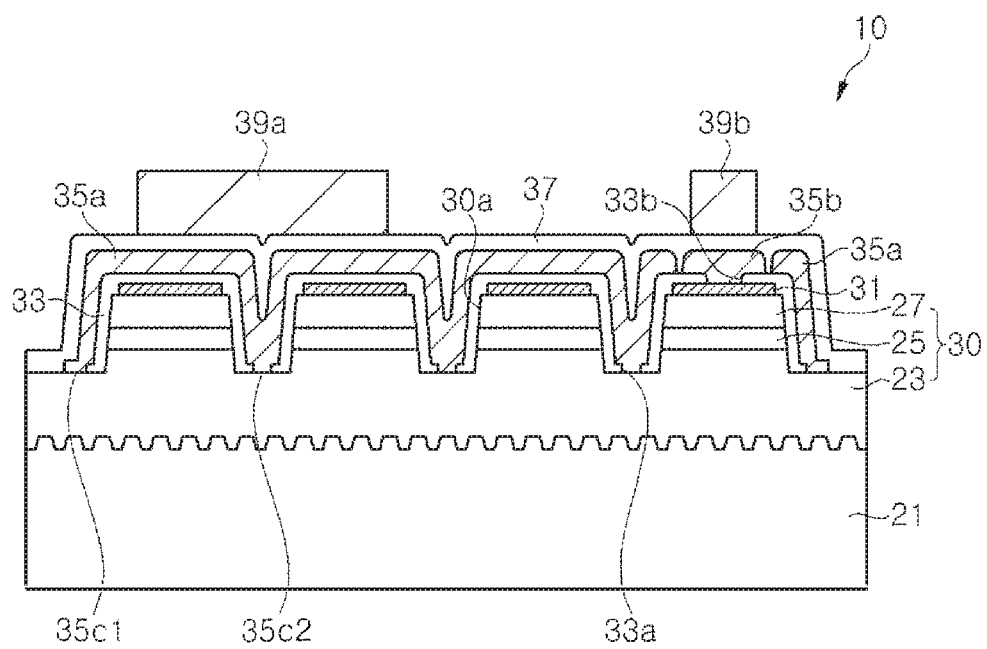
FIG. 18 is a cross-sectional view of the light emitting device taken along line A-A' of FIG. 1.
Figure 19:
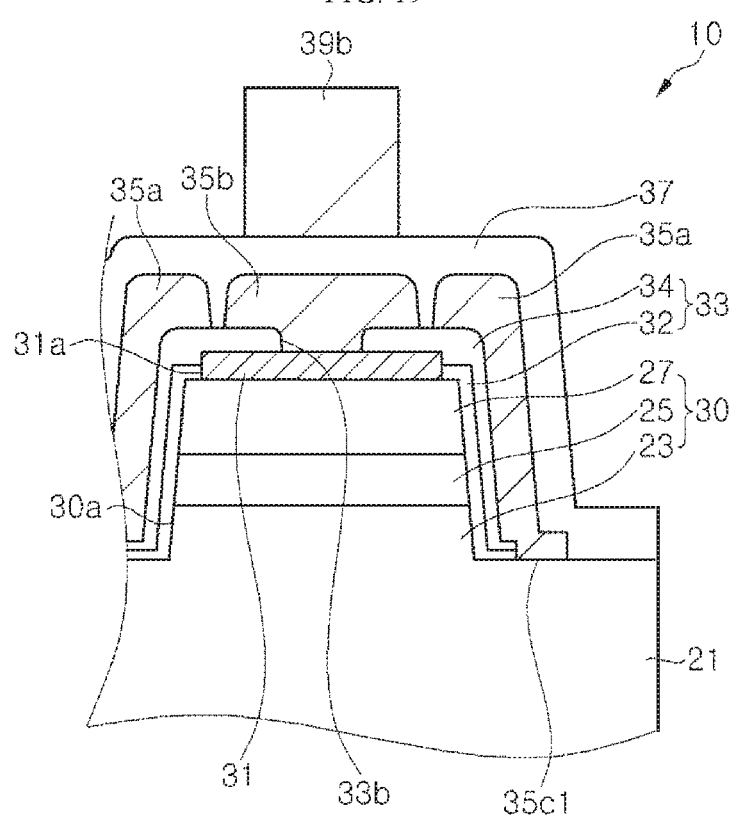
FIG. 19 is an enlarged sectional view of the light emitting device shown in FIG. 1.
Figure 20:
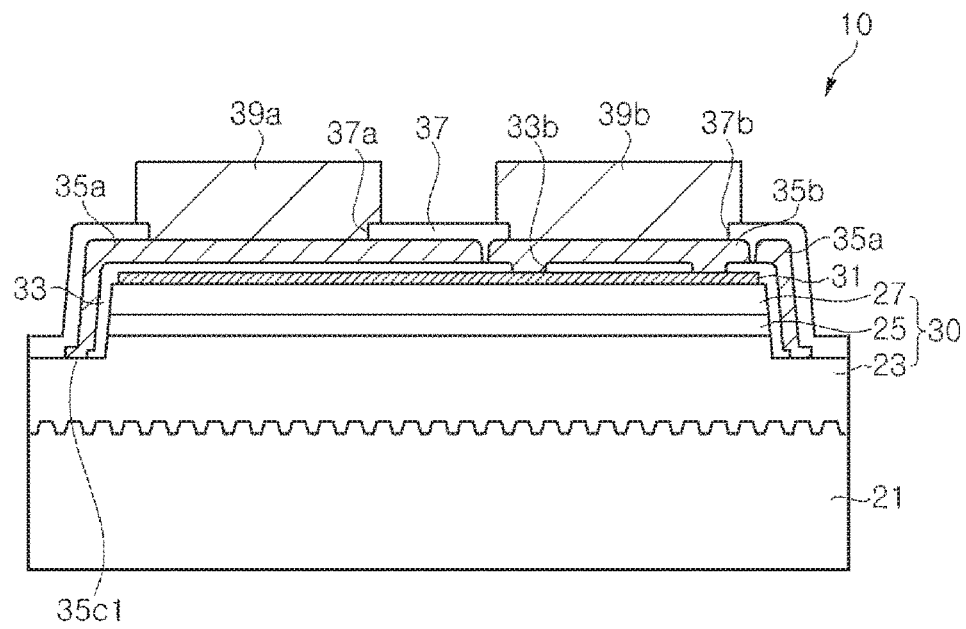
FIG. 20 is a cross-sectional view of the light emitting device taken along line B-B' of FIG. 3.

FIG. 17 is a schematic plan view of a light emitting device 10 according to an exemplary embodiment of the invention. FIG. 18 is a cross-sectional view of the light emitting device taken along line A-A' of FIG. 17. FIG. 19 is an enlarged sectional view of the light emitting device shown in FIG. 17. FIG. 20 is a cross-sectional view of the light emitting device taken along line B-B' of FIG. 17.

Referring to FIG. 17 to FIG. 20, the light emitting device 10 includes a first conductive type semiconductor layer 23, a mesa M, an active layer 25, a second conductive type semiconductor layer 27, a first contact layer 35a, a second contact layer 31, a first electrode pad 39a, and a second electrode pad 39b. The light emitting device 10 may further include a substrate 21, a lower insulation layer 33, an upper insulation layer 37, and an intermediate connection layer 35b.

The substrate 21 may be any substrate suitable for growth of the first conductive type semiconductor layer 23. For example, the substrate 21 may be selected from among a sapphire substrate, a gallium nitride substrate, an aluminum nitride substrate, and a silicon carbide substrate, or may be a patterned sapphire substrate.

As shown in FIG. 17, the substrate 21 may have a generally rectangular or square shape and has side surfaces. For example, the substrate 21 may have a square shape having a size of 1000 µm×1000 µm or 700 µm×700 µm, or may have a rectangular shape having a size of 1000 µm×1000 µm or 700 µm×700 µm.

A semiconductor stack structure 30 is disposed on the substrate 21. The semiconductor stack structure 30 includes the first conductive type semiconductor layer 23, the active layer 25, and the second conductive type semiconductor layer 27.

The first conductive type semiconductor layer 23 may be disposed over an upper surface of the substrate 21. The first conductive type semiconductor layer 23 is a layer grown on the substrate 21. The first conductive type semiconductor layer 23 may be a gallium nitride semiconductor layer doped with dopants, for example, Si. A concentration of the dopants may be in a range of, for example, $1E19/cm^3$ to $2E19/cm^3$.

The mesa M is disposed on the first conductive type semiconductor layer 23. The mesa M may be substantially disposed inside a region surrounded by the first conductive type semiconductor layer 23. In this manner, regions near an edge of the first conductive type semiconductor layer 23 are exposed to the outside, rather than being covered by the mesa M.

The mesa M includes the second conductive type semiconductor layer 27 and the active layer 25, and may include a partial thickness of the first conductive type semiconductor layer 23. The active layer 25 is interposed between the first conductive type semiconductor layer 23 and the second conductive type semiconductor layer 27. The active layer 25 may have a single quantum well structure or a multi-quantum well structure. In the active layer 25, the composition and thickness of well layers therein may determine the wavelength of light generated by the active layer 25. More particularly, the active layer 25 may emit UV light, blue light, or green light through adjustment of the composition of the well layers.

In the exemplary embodiment, the second conductive type semiconductor layer 27 may be a gallium nitride semiconductor layer doped with p-type dopants, for example, Mg. Each of the first conductive type semiconductor layer 23 and the second conductive type semiconductor layer 27 may have a single layer or multiple layers structure, and may include a super lattice layer.

As shown in FIG. 17, the mesa M may have a generally rectangular shape having rounded corners. The mesa M may also have a rectangular shape having rounded corners in a horizontal sectional view. The rounded corners may prevent current crowding at the corners of the mesa M.

The mesa M includes through-holes 30a therein. The first conductive type semiconductor layer 23 is exposed through the through-holes 30a. The through-holes 30a may be regularly arranged in the mesa M. Although FIG. 17 illustrates nine through-holes 30a arranged in a matrix shape in the mesa M, it is contemplated that the number and arrangement of the through-holes 30a may vary.

The second contact layer 31 is disposed on the mesa M and contact the second conductive type semiconductor layer 27. The second contact layer 31 may be disposed on substantially the entire upper region of the mesa M. For example, the second contact layer 31 may cover 80% or more, for example, 90% or more, of the upper region of the mesa M.

The second contact layer 31 may include a reflective metal lay figured to reflect light generated by the active layer 25 towards the substrate 21. For example, the second contact layer 31 may include metal layers of Ag/Ni/Ti/Pt that are sequentially stacked. Alternatively, the second contact layer 31 may be a transparent oxide layer, for example, indium tin oxide (ITO) or zinc oxide (ZnO).

The first contact layer 35a covers the upper region of the mesa M. The first contact layer 35a includes an exterior contact portion 35c1 and interior contact portions 35c2, both of which contact the first conductive type semiconductor layer 23. The exterior contact portion 35c1 contacts the first conductive type semiconductor layer 23 near an edge of the substrate 21 in a ring shape along the periphery of the mesa M. The interior contact portions 35c2 contact portions of the first conductive type semiconductor layer 23 exposed through the through-holes 30a. Shapes and locations of the exterior contact portion 35c1 and interior contact portions 35c2 may be varied, which will be described in more detail below.

The first contact layer 35a may have an opening on the upper region of the mesa M, particularly, on the second contact layer 31, and the intermediate connection layer 35b may be disposed inside the opening. In this manner, the intermediate connection layer 35b may be surrounded by the first contact layer 35a while being separated from the first contact layer 35a. The first contact layer 35a may be disposed on the entire upper region, side region, and exterior region of the mesa M. The intermediate connection layer 35b may be substantially disposed within the upper region of the mesa M.

The intermediate connection layer 35b may be formed together with the first contact layer 35a. As such, the intermediate connection layer 35b and the first contact layer 35a may include the same material. The first contact layer 35a and the intermediate connection layer 35b may include an Al layer, and may further include a Ti layer as an uppermost layer. For example, the first contact layer 35a and the intermediate connection layer 35b may include Al/Ti/Pt/Au/Ti/Ni/Au/Ti. As described below, the uppermost Ti layer may be disposed at an interface of the upper insulation layer 37 to improve bonding strength of the upper insulation layer 37. Alternatively, the Ti layer may be removed from each interface between the first electrode pad 39a and the second electrode pad 39b, and between the first contact layer 35a and the intermediate connection layer 35b. In this manner, Au layers of the first contact layer 35a and the intermediate connection layer 35b may be exposed and bonded to metal layers, for example, Cu layers of the first electrode pad 39a and the second electrode pad 39b.

The lower insulation layer 33 is disposed between the first contact layer 35a and the mesa M, and insulates the first contact layer 35a from the mesa M and the second contact layer 31. As shown in FIG. 19, the lower insulation layer 33 may include a first insulation layer 32 and a second insulation layer 34. The first insulation layer 32 may cover the mesa M around the second contact layer 31. The first insulation layer 32 may include, for example, silicon nitride, and may cover the side surface of the mesa M while covering a portion of the first conductive type semiconductor layer 23. The second insulation layer 34 covers the first insulation layer 32 and a portion of the second contact layer 31. The second insulation layer 34 may include, for example, silicon oxide.

The lower insulation layer 33 has openings 33a formed inside the through-holes 30a that expose the first conductive type semiconductor layer 23. The interior contact portions 35c2 of the first contact layer 35a contact the first conductive type semiconductor layer 23 through the openings 33a. Further, the lower insulation layer 33 covers a portion of the first conductive type semiconductor layer 23 around the mesa M while exposing the first conductive type semiconductor layer 23, such that the exterior contact portion 35c1 may contact the first conductive type semiconductor layer 23.

The lower insulation layer 33 may be interposed between the intermediate connection layer 35b and the second contact layer 31, and may include openings 33b that expose the second contact layer 31. Alternatively, a plurality of openings 33b having a small size may be formed at various locations to expose the second contact layer 31, or a smaller number of openings or a single opening may be formed to expose the second contact layer 31. The intermediate connection layer 35b May be connected to the second contact layer 31 through the openings 33b.

The upper insulation layer 37 is disposed on the first contact layer 35a and the intermediate connection layer 35b. The upper insulation layer 37 includes an opening 37a that exposes the first contact layer 35a, and an opening 37b that exposes the intermediate connection layer 35b. Alternatively, each openings 37a and 37b may be formed in plural to expose the first contact layer 35a and the intermediate connection layer 351, or a single opening 37a and a single opening 37b may be formed to expose the first contact layer 35a and the intermediate connection layer 35b, respectively.

The upper insulation layer 37 may also cover the exterior contact portion 35c1 and an exposed surface near the edge of the substrate 21. The upper insulation layer 37 protects the first contact layer 35a and the intermediate connection layer 35b by covering the first contact layer 35a and the intermediate connection layer 35b.

The upper insulation layer 37 may include a single layer of silicon oxide. The upper insulation layer 37 may alternatively have a multilayer structure including a silicon nitride layer and a silicon oxide layer, or a distributed Bragg reflector structure, in which silicon oxide layers and titanium oxide layers are alternately stacked one above another.

The first electrode pad 39a is electrically connected to the first contact layer 35a through the openings 37a of the upper insulation layer 37. The second electrode pad 39b is electrically connected to the intermediate connection layer 35b through the openings 37b. In this manner, the second electrode pad 39b may be electrically connected to the second contact layer 31 through the intermediate connection layer 35b. When the intermediate connection layer 35b is omitted, the second electrode pad 39b may be directly connected to the second contact layer 31.

As shown in FIG. 17, the first electrode pad 39a may have substantially a rectangular shape. The second electrode pad 39b may also have a substantially rectangular shape. Alternatively, the second electrode pad 39b may have a section with elongate structures such as fingers, as shown in FIG. 17, which extend from a common base towards the first electrode pad 39a.

The fingers may assist in preventing voids from being trapped under the second electrode pad 39b upon mounting the second electrode pad 39b on a printed circuit board or submount through conductive pastes. More particularly, the voids may easily escape to regions between the fingers. Furthermore, the fingers may be disposed above and between the through-holes 30a. In this manner, the fingers may not to overlap the through-holes 30a, which may prevent formation of relatively large grooves in the second electrode pad 39b.

In the light emitting device 10 according to the exemplary embodiment, the upper surface of the mesa M has rounded corners, such that current crowding near the corners of the mesa M may be prevented. Furthermore, with the exterior contact portion 35c1 and the interior contact portions 35c2 of the first contact layer 35a, the light emitting device 10 may have uniform current spreading in the first conductive type semiconductor layer 23.

FIG. 21 to FIG. 25 are plan views illustrating a method of manufacturing a light emitting device according to an exemplary embodiment of the invention.

Figure 21:
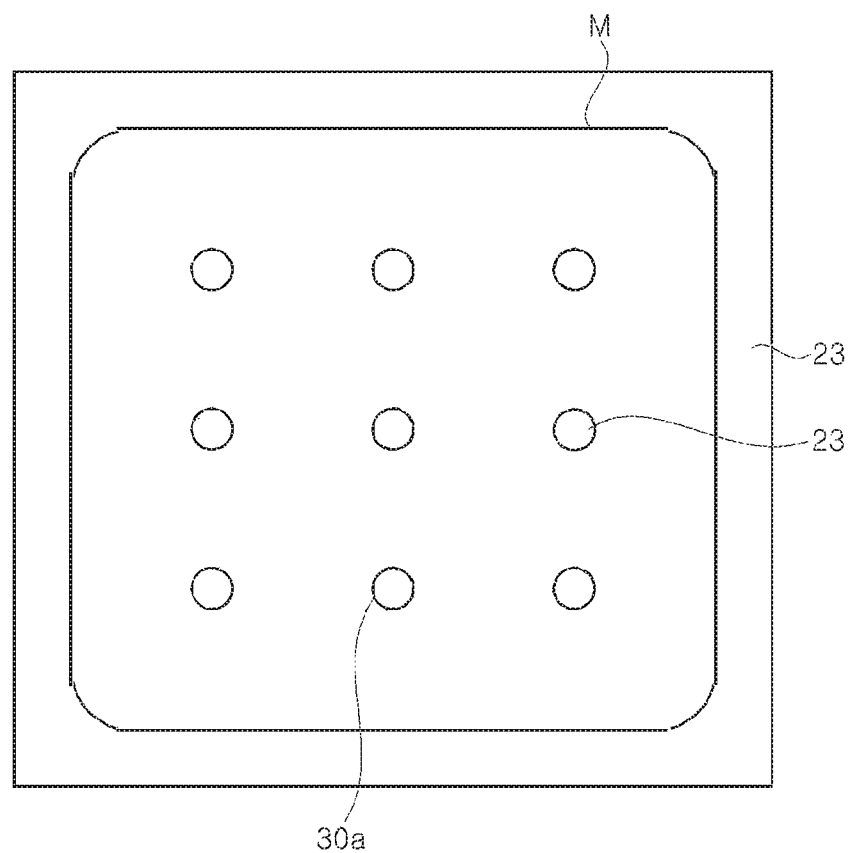
FIG. 21, FIG. 22, FIG. 23, FIG. 24, and FIG. 25 are plan views illustrating a method of manufacturing a light emitting device, according to another exemplary embodiment of the invention.

Referring to FIGS. 18 and 21, a first conductive type semiconductor layer 23, an active layer 25 and a second conductive type semiconductor layer 27 are grown on a substrate 21.

For example, the first conductive type semiconductor layer 23 may include an n-type gallium nitride layer and the second conductive type semiconductor layer may include a p-type gallium nitride layer. The active layer may have a single quantum well structure or a multi-quantum well structure, and may include a well layer and a barrier layer. The well layer may have compositional elements selected depending upon the wavelength of light, and may include, for example, indium gallium nitride (InGaN).

The first conductive type semiconductor layer 23, the active layer, and the second conductive type semiconductor layer may be grown on a gallium nitride substrate 21 by metal organic chemical vapor deposition (MOCVD).

Then, a mesa M is formed on the first conductive type semiconductor layer 23 by patterning the second conductive type semiconductor layer and the active layer. The mesa. M includes the active layer and the second conductive type semiconductor layer, and may include some thickness of the first conductive type semiconductor layer 23. When the mesa M is formed, through-holes 30a may be formed through the second conductive type semiconductor layer and the active layer to expose the first conductive type semiconductor layer 23.

The mesa M is disposed inside an edge region of the first conductive type semiconductor layer 23, and the through-holes 30a are disposed inside the mesa M region. The number of through-holes 30a formed in the mesa M may be varied.

A side surface of the mesa M may be slanted by, for example, photoresist reflow. A slanted side surface of the mesa M may improve extraction efficiency of light generated in the active layer. An upper surface of the mesa M has rounded corners. A horizontal cross-section of the mesa M also may have rounded corners.

Figure 22:
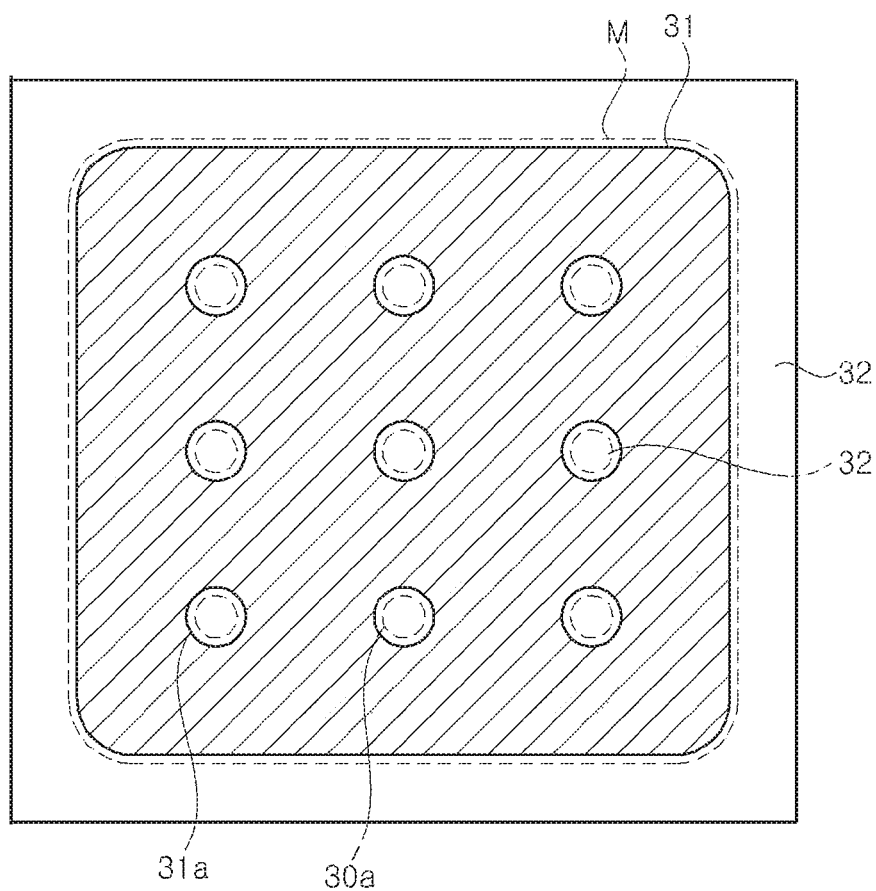

Referring to FIG. 22, a second contact layer 31 is formed on the mesa M. The second contact layer 31 forms ohmic contact with the second conductive type semiconductor layer. The mesa M region around the second contact layer 31 and the first conductive type semiconductor layer 23 may be covered by a first insulation layer 32.

More specifically, the first insulation layer 32 may be formed to cover the first conductive type semiconductor layer 23 and the mesa M. The first insulation layer 32 may include silicon nitride by, for example, chemical vapor deposition.

A photoresist pattern having an opening that exposes an upper region of the mesa. M is formed on the first insulation layer 32. The opening may have a shape generally similar to the shape of the mesa M, and may be formed to be slightly smaller than the mesa M. A photoresist may be deposited to cover edges of the mesa M. Further, the photoresist covers the through-holes 30a and the mesa M region around the through-holes 30a. A width of an entrance of the opening may be greater a width of a bottom entrance of the opening. The photoresist pattern having such an opening may be formed by, for example, using a negative type photoresist.

Thereafter, the first insulation layer 32 is etched using the photoresist pattern as an etching mask, whereby the second conductive type semiconductor layer is exposed. The first insulation layer 32 may be subjected to, for example, wet etching.

Thereafter, a second contact layer 31 is formed. The second contact layer 31 may be formed on the mesa M through a coating technology using e-beam evaporation. The second contact layer 31 may include multiple metal layers of, for example, Ag/Ni/Ti/Pt, or may include a transparent conductive material, such as ITO or ZnO. Then, the photoresist pattern is removed. As a result, the mesa M is covered by the first insulation layer 32 and the second contact layer 31. More particularly, the second contact layer 31 contacting the second conductive type semiconductor layer remains on the mesa M, and the first insulation layer 32 remains around the second contact layer 31. The first insulation layer 32 may cover an exposed portion of the first conductive type semiconductor layer 23.

Figure 23:
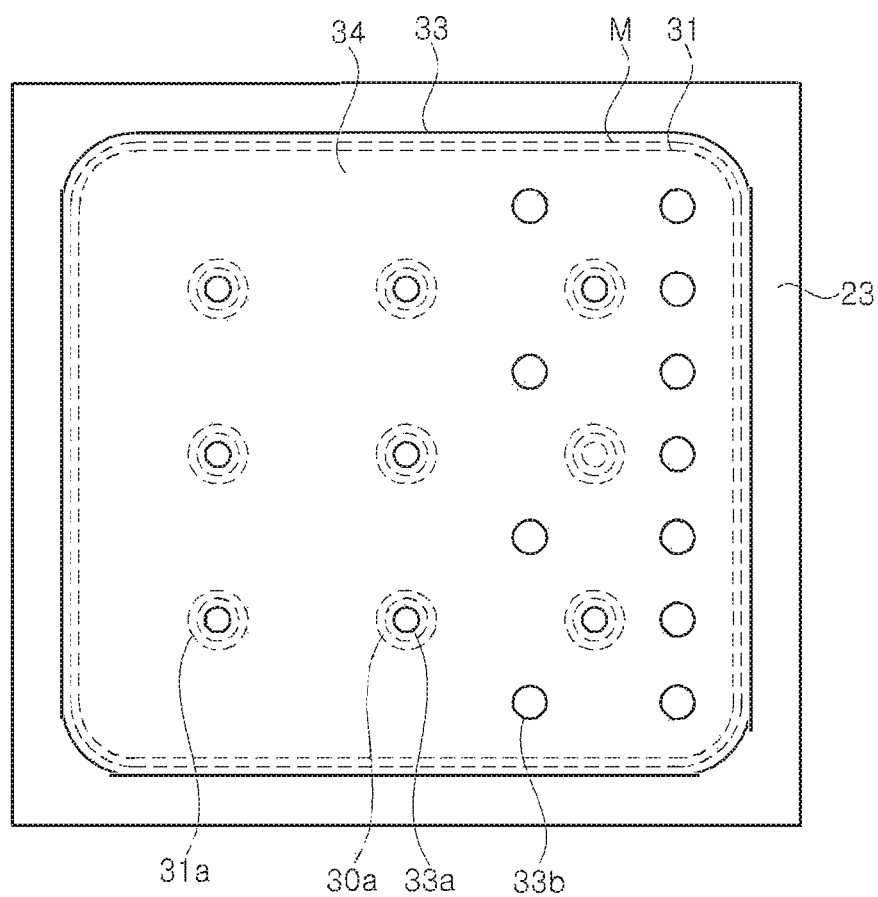

Referring to FIG. 23, a lower insulation layer 33 is formed to cover the mesa M and the first conductive type semiconductor layer 23 around the mesa M. The lower insulation layer 33 has openings 33a that expose the first conductive type semiconductor layer 23 in the through-holes 30a, and also exposes the edge region of the first conductive type semiconductor layer 23. Furthermore, the lower insulation layer 33 may have an opening 33b that exposes the second contact layer 31. As shown in FIG. 23, the opening 33b is disposed near one side of the mesa M. The opening 33b may be formed in plural.

As shown in FIG. 19, the lower insulation layer 33 may include a first insulation layer 32 and a second insulation layer 34. The second insulation layer 34 covers the second contact layer 31 while covering the first insulation layer 32.

For example, the lower insulation layer 33 may be formed by forming the second insulation layer 34 to cover the first insulation layer 32 and the second contact layer 31. The second insulation layer 34 may be patterned together with the second insulation layer 34 and the first insulation layer 32 to form the openings 33a and the openings 33b. Then, the first insulation layer 32 and the second insulation layer 34 remaining on the first conductive type semiconductor layer 23 around the mesa M are removed to form the lower insulation layer 33.

The second insulation layer 34 may be formed of an oxide material, such as $SiO_2$, by chemical vapor deposition (CVD) and the like, and the openings 33a and 33b may be formed by photolithography and etching.

Figure 24:
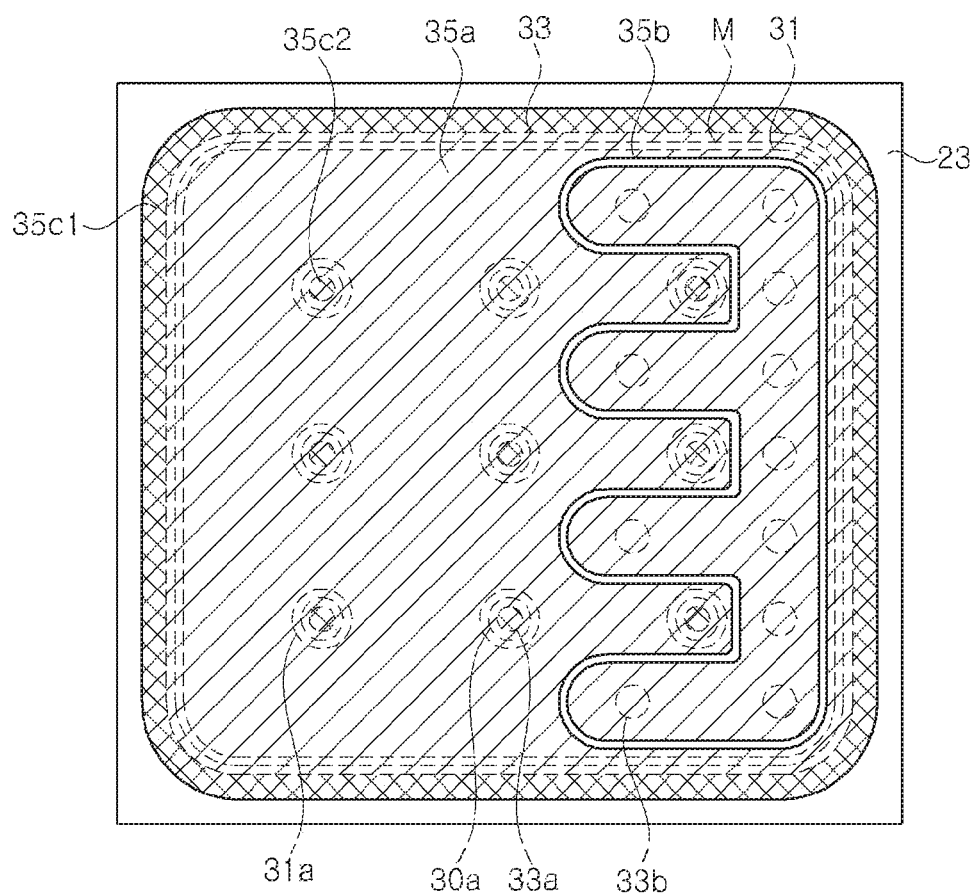

Referring to FIG. 24, a first contact layer 35a and an intermediate connection layer 35b are formed on the lower insulation layer 33. The first contact layer 35a and the intermediate connection layer 35b may be simultaneously formed using the same materials by, for example, lift-off process. For example, the first contact layer 35a and the intermediate connection layer 35b may include Al/Ti/Pt/Au/Ti/Ni/Au/Ti.

The first contact layer 35a has an exterior contact portion 35c1 that contacts a portion of the first conductive type semiconductor layer 23 exposed around the mesa M, and interior contact portions 35c2 that contact a portion of the first conductive type semiconductor layer 23 exposed through the openings 33a of the lower insulation layer 33. The exterior contact portion 35c1 may have a ring shape surrounding the mesa M.

The intermediate connection layer 35b is electrically insulated from the first contact layer 35a. Referring back to FIGS. 18 and 19, the intermediate connection layer 35b may be disposed between the openings of the first contact layer 35a to be surrounded by the first contact layer 35a. The intermediate connection layer 35b is connected to the second contact layer 31 through the openings 33b of the lower insulation layer 33. The intermediate connection layer 35b may have a finger shape. Although the intermediate connection layer 35b is described as being formed together with the first contact layer 35a, the intermediate connection layer 35b may be alternatively omitted.

Figure 25:
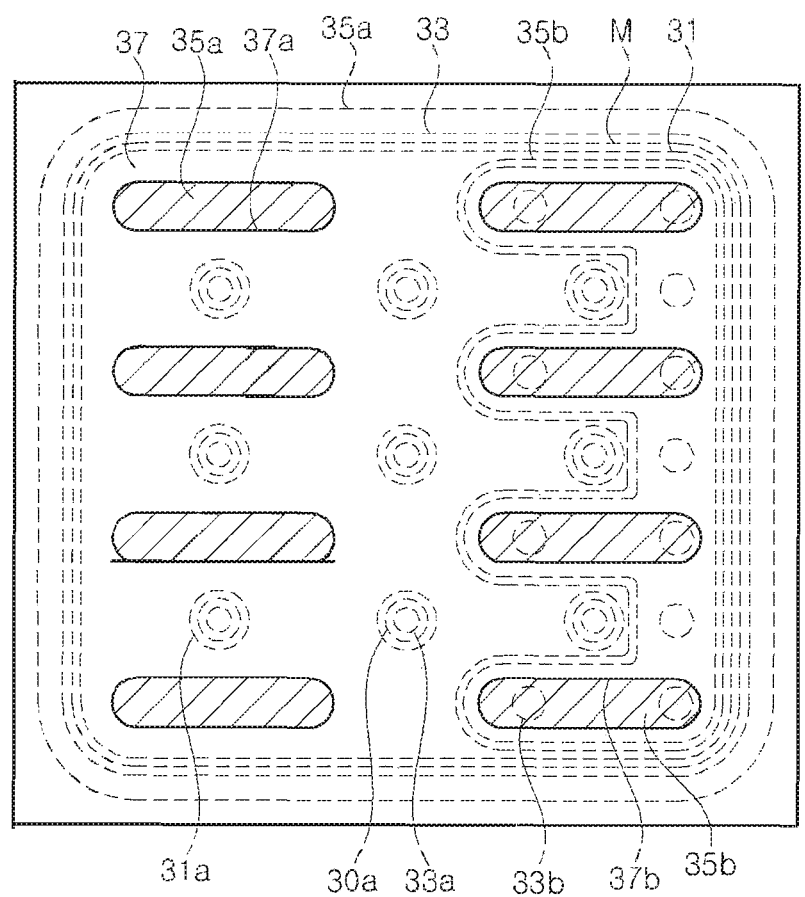

Referring to FIG. 25, an upper insulation layer 37 is formed on the first contact layer 35a and the intermediate connection layer 35b. The upper insulation layer 37 has openings 37a that expose the first contact layer 35a, and openings 37b that expose the intermediate connection layer 35b. The openings 37a may be formed to overlap the first contact layer 35a. The openings 37b may be formed on the intermediate connection layer 35b to overlap the second contact layer 31. The openings 37a and 37b may be formed by patterning the insulation layer 37 through photolithography and etching. More particularly, the uppermost layers of the first contact layer 35a and the intermediate connection layer 35b, that is, Ti layers, may be removed during formation of the openings 37a and 37b. Although the openings 37a and 37b are described as being separated from each other, the openings 37a or 37b may be alternatively connected to each other to form a single opening.

The openings 37b may be disposed to overlap the second contact layer 31 and have a smaller sire intermediate connection layer 35b. Accordingly, an edge and sidewalk of the intermediate connection layer 35b are covered by the upper insulation layer 37. Furthermore, sidewalls of the openings of the first contact layer 35a are also covered by the upper insulation layer 37. The upper insulation layer 37 may have a single layer of silicon nitride or silicon oxide, multiple layers thereof, or a distributed Bragg reflector structure.

Referring back to FIG. 17, a first electrode pad 39a and a second electrode pad 39b are formed on the upper insulation layer 37. The first electrode pad 39a is connected to the first contact layer 35a through the openings 37a of the upper insulation layer 37, and the second electrode pad 39b is connected to the intermediate connection layer 35b through the openings 37b of the upper insulation layer 37. The first electrode pad 39a and the second electrode pad 39b are used to mount the light emitting device 10 on a submount or a printed circuit board. The first electrode pad 39a and the second electrode pad 39b may include Cu.

In the exemplary embodiment, the second electrode pad 39b and the intermediate connection layer 35b have a similar shape. More particularly, the second electrode pad 39b may include fingers and be disposed on the intermediate connection layer 35b. In the exemplary embodiment, the second electrode pad 39b may have a smaller area than the intermediate connection layer 35b, and is substantially disposed on the intermediate connection layer 35b. Then, the substrate 21 is divided into individual light emitting devices, thereby providing individually divided light emitting devices, as shown in FIG. 17 to FIG. 20.

Figure 26:
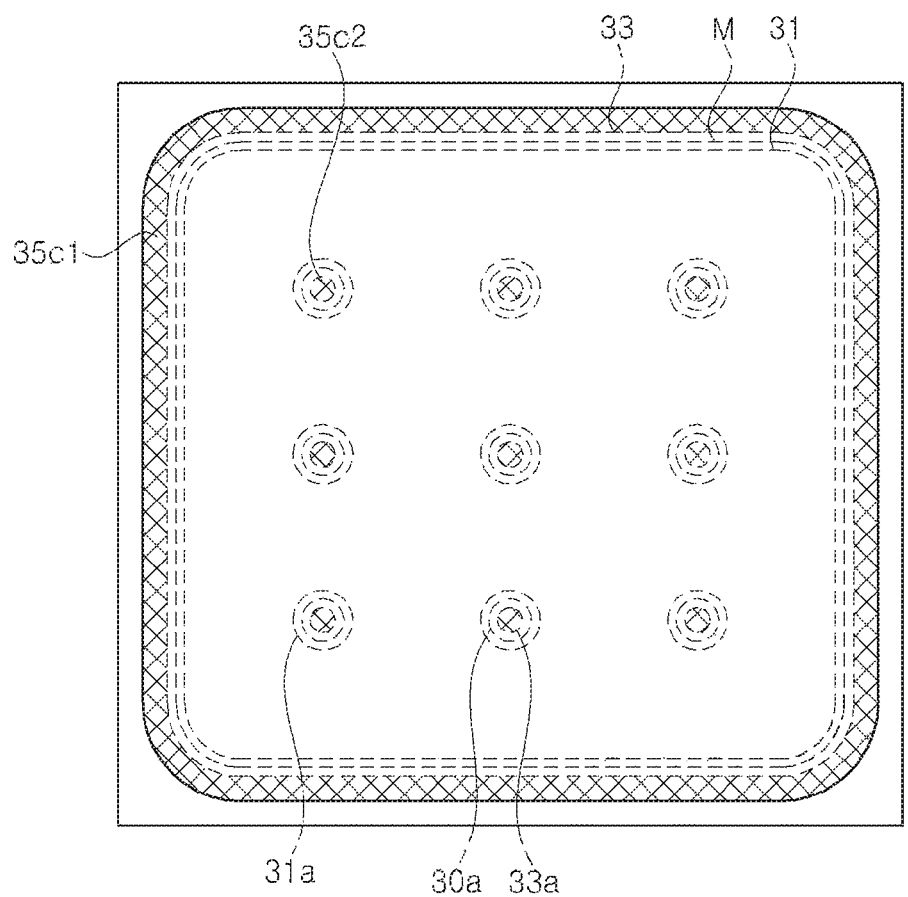
FIG. 26 is a schematic plan view of an exterior contact portion and interior contact portions of a light emitting device, according to yet another exemplary embodiment of the invention.

FIG. 26 is a schematic plan view of the exterior contact portion 35c1 and interior contact portions 35c2 of the light emitting device, according to an exemplary embodiment of the invention.

Referring to FIG. 26, in the light emitting device according to the exemplary embodiment, the exterior contact portion 35c1 surrounds the mesa M in a ring shape. The exterior contact portion 35c1 is separated from the mesa M by the lower insulation layer 33. The interior contact portions 35c2 contact the first conductive type semiconductor layer 23 exposed through the openings 33a of the lower insulation layer 33 within the through-holes 30a.

Figure 27:
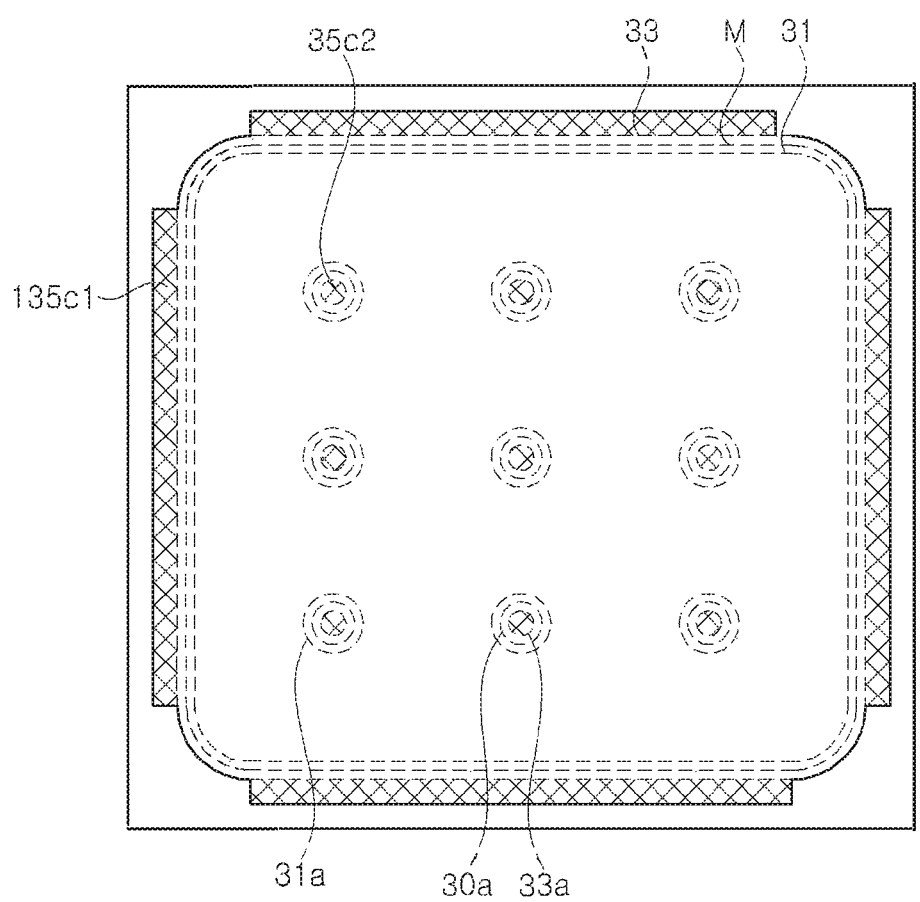
FIG. 27 is a schematic plan view of a modification of the exterior contact portion of a light emitting device, according to another exemplary embodiment of the invention.

FIG. 27 is a schematic plan view of an exterior contact portion of the light emitting device, according to an exemplary embodiment of the invention.

Referring to FIG. 27, exterior contact portions 135c1 are formed near each of side surfaces of the mesa M. Here, the exterior contact portions 135c1 are separated from each other near corners of the mesa M. For example, the lower insulation layer 33 may remain on the first conductive type semiconductor layer 23 near the corners of the mesa M to prevent the first contact layer 35a from contacting the first conductive type semiconductor layer 23. The first contact layer 35a may be removed from regions near the corners of the mesa M.

In the exemplary embodiment, since the exterior contact portions 135c1 are separated from each other near the corners of the mesa M, current crowding near the corners of the mesa M may be prevented.

Figure 28:
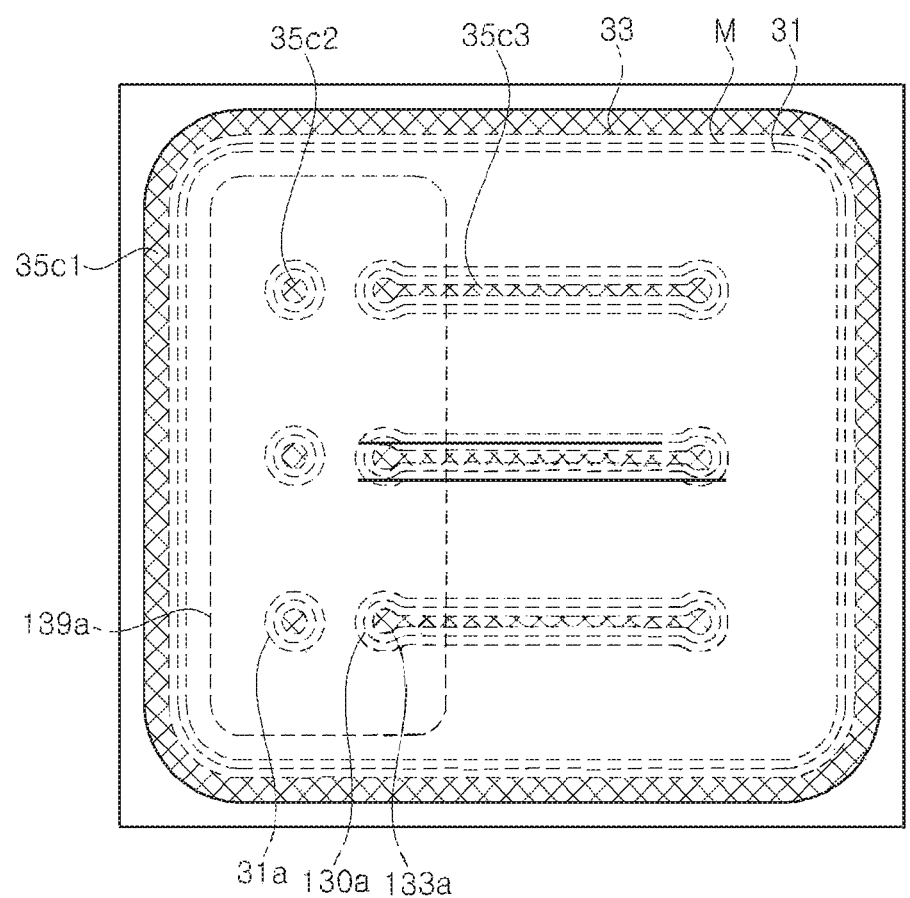
FIG. 28 is a schematic plan view of a modification of the interior contact portions of a light emitting device, according to an exemplary embodiment of the invention.

FIG. 28 is a schematic plan view of an interior contact portions of the emitting device, according to an exemplary embodiment of the invention.

Referring to FIG. 28, the interior contact portions include elongated interior contact portions 35c3. The interior contact portions may include the interior contact portions 35c2 described above. A first electrode pad 139a may be disposed on a portion of the interior contact portions 35c2 and the interior contact portions 35c3.

To form the interior contact portions 35c3, through-holes 130a are formed in the mesa M, and openings 133a of the lower insulation layer 33 are formed in the through-holes 130a. The through-holes 130a and the openings 133a have an elongated shape. With the elongated interior contact portions 35c3, the light emitting device may have more efficient current spreading in the first conductive type semiconductor layer 23.

Figure 29:
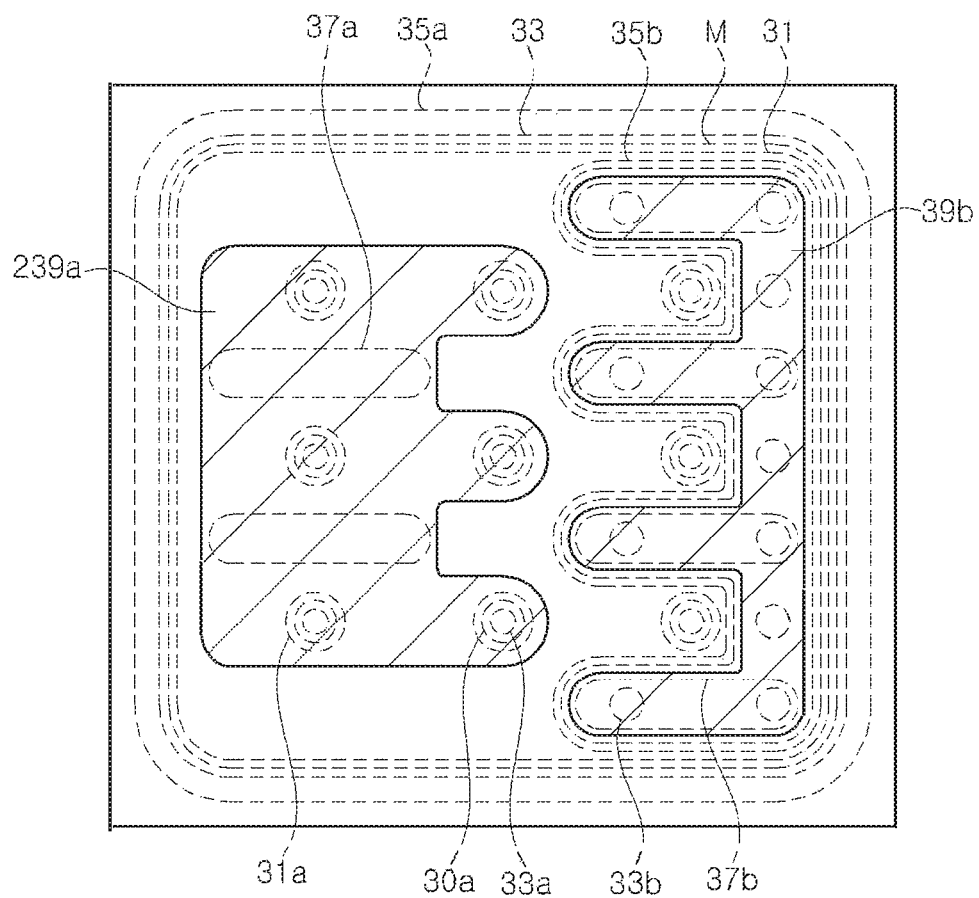
FIG. 29 is a schematic plan view of a modification of a first electrode pad of a light emitting device, according to an exemplary embodiment of the invention.

FIG. 29 is a schematic plan view of a first electrode pad of the light emitting device, according to an exemplary embodiment of the invention.

Referring to FIG. 29, a first electrode pad 239a includes fingers. The fingers of the first electrode pad 239a and the fingers of the second electrode pad 39b may be opposed to face each other or alternately disposed. In this manner, the fingers may have a greater length.

Figure 30:
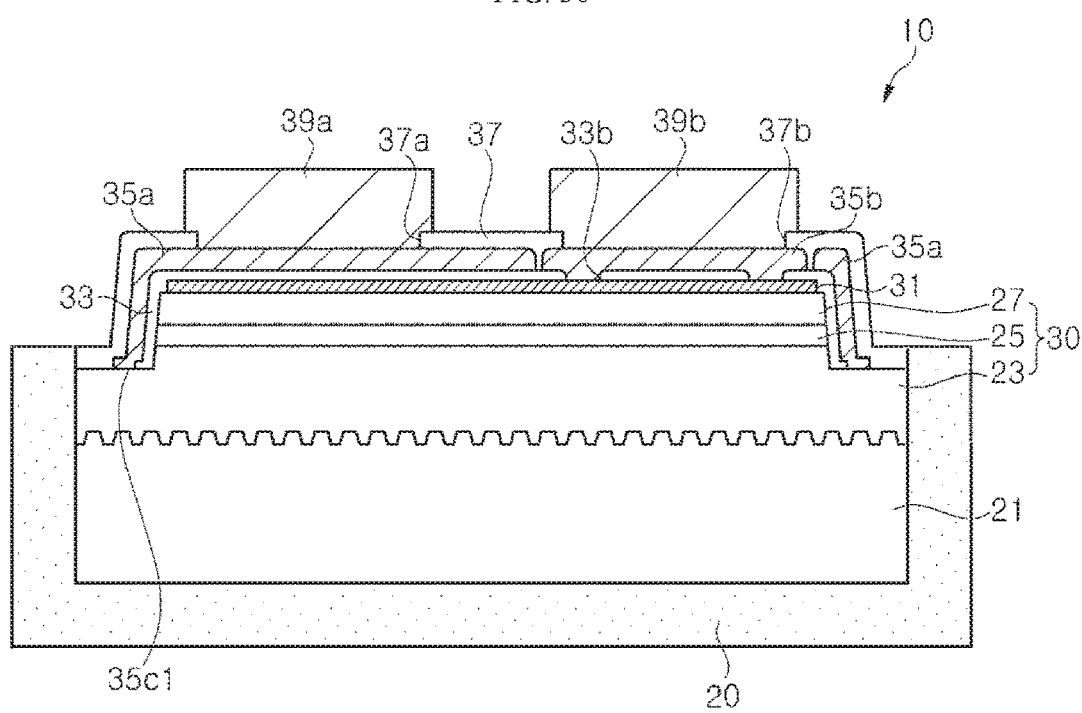
FIG. 30 is a schematic sectional view of a light emitting device including a wavelength conversion layer constructed according to the principles of the invention.

FIG. 30 is a schematic sectional view of a light emitting device including a wavelength conversion layer.

Referring to FIG. 30, a wavelength conversion layer 20 is formed on a side of the substrate 21 of the light emitting device 10. The wavelength conversion layer 20 covers a lower surface of the substrate 21. Furthermore, the wavelength conversion layer 20 may cover a side surface of the substrate 21 and a side surface of the first conductive type semiconductor layer 23. The wavelength conversion layer 20 may also cover a portion of the upper insulation layer 37.

The wavelength conversion layer 20 of the light emitting device 10 may convert wavelengths of light generated in the active layer 25. In this manner, the light emitting device 10 may realize mixed light, for example, white light, of wavelength-converted light, and light generated in the active layer 25.

Figure 31:
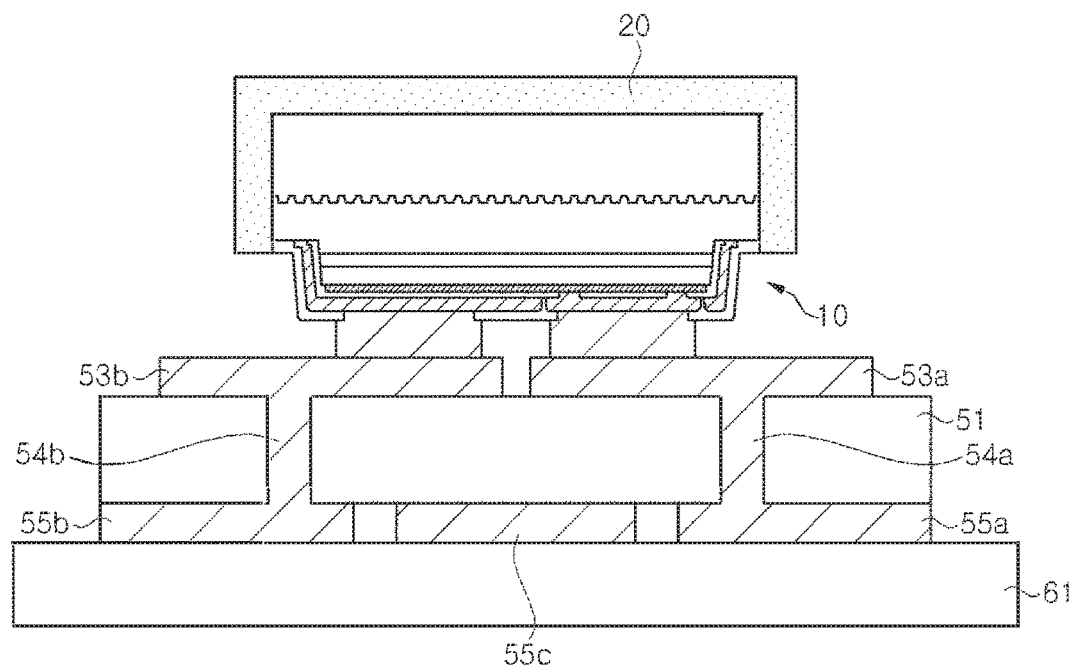
FIG. 31 is a schematic sectional view of a light emitting module, according to an exemplary embodiment of the invention.
Figure 32A:
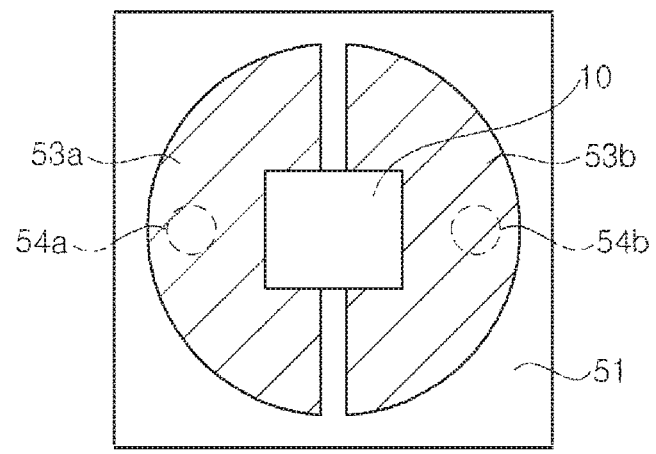
FIG. 32A and FIG. 32B are a schematic plan view and a schematic rear view of a submount substrate of a light emitting module constructed, according to exemplary embodiments of the invention, respectively.
Figure 32B:
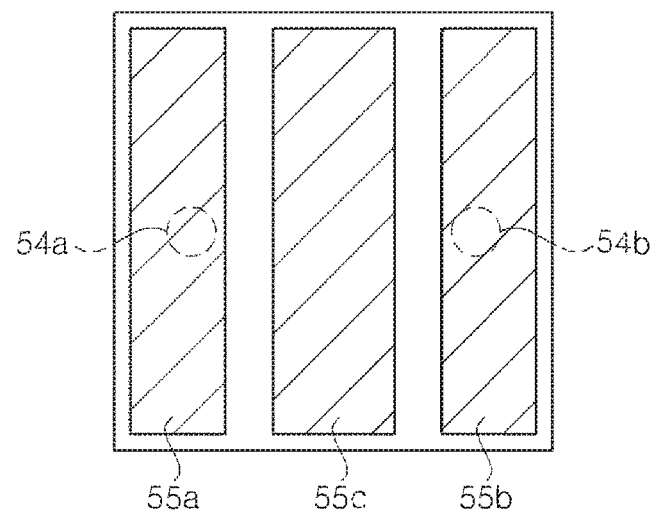

FIG. 31 is a schematic sectional view of a light emitting module, according to an exemplary embodiment of the invention. FIG. 32A and FIG. 32B are respectively a schematic plan view and a schematic rear view of a submount substrate of the light emitting module according to an exemplary embodiment of the invention, respectively.

Referring to FIG. 31, a light emitting module includes a printed circuit board (PCB) 61, a submount 51, and a light emitting device 10. As described with reference to FIG. 30, the light emitting device 10 may include the wavelength conversion layer 20. The submount 51 may be omitted.

The printed circuit board 61 may be a metal PCB, such as an Al-PCB or a Cu-PCB, or a ceramic PCB. Since Cu has higher thermal conductivity than Al, the Cu-PCB may more rapidly dissipate heat from the light emitting device 10.

Referring to FIG. 31, FIG. 32A, and FIG. 32B, the submount 51 includes an upper electrode pattern and a lower electrode pattern formed on a base substrate. The upper electrode pattern includes a first upper electrode 53a and a second upper electrode 53b, and the lower electrode pattern includes a first lower electrode 55a and a second lower electrode 55b, and may further include a heat dissipation pad 55c.

The base substrate of the submount 51 may be an AlN substrate. Each of the upper and lower electrode patterns may have a multilayer structure, in which Ni/Cu/Au layers are stacked. The Ni layer is used to improve bonding strength of electrode patterns to the AlN, and the Au layer is used to prevent oxidation of the Cu layer while improving bonding strength of the light emitting device 10 to the electrode pads 39a and 39b. The Cu layer is used for current and heat transfer, and is thicker than the Ni layer and the Au layer.

Vias 54a and 54b are formed through the AlN substrate 51, such that the first and second upper electrodes 53a and 53b are connected to the first and second lower electrodes 55a and 55b through the vias 54a and 54b.

The heat dissipation pad 55c is disposed between the first and second lower electrodes 55a and 55b, and is electrically insulated from the first and second lower electrodes 55a and 55b. The heat dissipation pad 55c contacts the printed circuit board 61, particularly, a metal of the metal PCB 61 to assist in dissipation of heat.

The light emitting device 10 is the same as the light emitting device described with reference to FIG. 17, and a detailed description of the light emitting device 10 is not necessary. The light emitting device 10 may be turned upside down to have a flip-chip shape, and then mounted on the submount 51. The electrode pads 39a and 39b (see FIG. 17) of the light emitting device 10 may be bonded to the first and second upper electrodes 53a and 53b of the submount 51.

With the submount 51 and the metal PCB 61, the light emitting module may easily dissipate heat from the light emitting device 10, thereby further improving current density for operation of the light emitting device 10.

Figure 33:
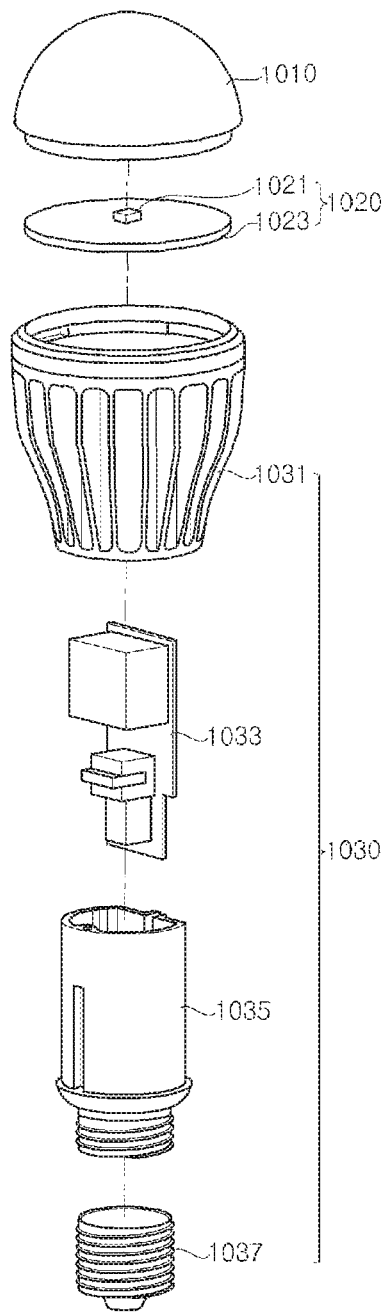
FIG. 33 is an exploded perspective view of an exemplary lighting apparatus to which a light emitting device according to exemplary embodiments of the invention is applied.

FIG. 33 is an exploded perspective view of an exemplary lighting apparatus to which a light emitting device according to exemplary embodiments of the invention is applied.

Referring to FIG. 33, the lighting apparatus according to the exemplary embodiment includes a diffusive cover 1010, a light emitting diode module 1020, and a body 1030. The body 1030 may receive the light emitting diode module 1020, and the diffusive cover 1010 may be disposed in the body 1030 to cover an upper side of the light emitting diode module 1020.

The body 1030 may have any shape, so long as the body 1030 may supply electric power to the light emitting diode module 1020 and receive and support the light emitting diode module 1020. The body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip (not shown). The IC chip may regulate, change, or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035, and may serve as a passage through which power may be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be utilized. For example, the substrate 1023 may include a printed circuit board having interconnects formed thereon. The substrate 1023 may have a shape corresponding to a securing portion formed at the upper portion of the body case 1031, so as to be stably secured to the body case 1031. The light emitting diode 1021 may include at least one of the light emitting diodes and the light emitting devices according to the exemplary embodiments the invention described above.

The diffusive cover 1010 is disposed on the light emitting diode 1021 and may be secured to the body case 1031 to cover the light emitting diode 1021. The diffusive cover 1010 may be formed of or include a light-transmitting material, and light orientation of the lighting apparatus may be adjusted through regulation of the shaped optical transmissivity of the diffusive cover 1010. As such, the diffusive cover 1010 may be modified in various shapes depending on usage and applications of the lighting apparatus.

Figure 34:
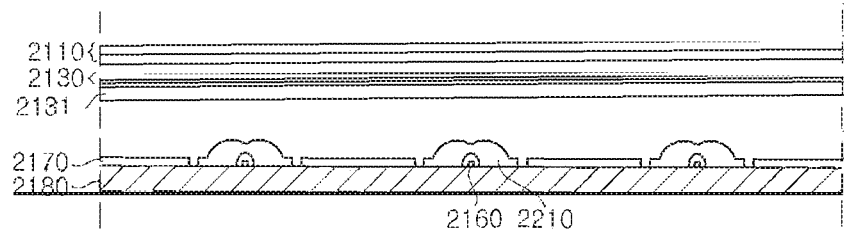
FIG. 34 is a sectional view of an exemplary display device to which a light emitting device according to exemplary embodiments of the invention is applied.

FIG. 34 is a sectional view of an exemplary display device to which a light emitting device according to exemplary embodiments of the invention is applied.

The display device according to the exemplary embodiment includes a display panel 2110, a backlight unit supplying light to the display panel 2110, and a panel guide supporting a lower edge of the display panel 2110.

The display panel 2110 may be, for example, a liquid crystal panel including a liquid crystal layer. Gate driving PCBs may be further disposed at the edge of the display panel 2110 to supply driving signals to a gate line. Here, the gate driving PCBs may be formed on a thin film transistor substrate instead of being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. However, it should be understood that other implementations are also possible. When a reflective material is coated onto a surface thereof, the substrate may alternatively be disposed on the reflective sheet 2170. In this manner, a plurality of substrates may be arranged parallel to one other. Alternatively, the light source module may include a single substrate.

The light emitting diodes 2160 may include at least one of the light emitting diodes and the light emitting devices according to the exemplary embodiments of the invention described above. The light emitting diodes 2160 may be regularly arranged in a predetermined pattern on the substrate. In addition, a lens 2210 is disposed on each of the light emitting diodes 2160 to improve uniformity of light emitted from the plurality of light emitting diodes 2160.

The diffusive plate 2131 and the optical sheets 2130 are disposed on the light emitting devices. Light emitted from the light emitting diodes 2160 may be supplied in the form of sheet light to the display panel 2110 through the diffusive plate 2131 and the optical sheets 2130. In this manner, the light emitting diodes 2160 according to the exemplary embodiments of the invention may be applied to direct type displays.

Figure 35:
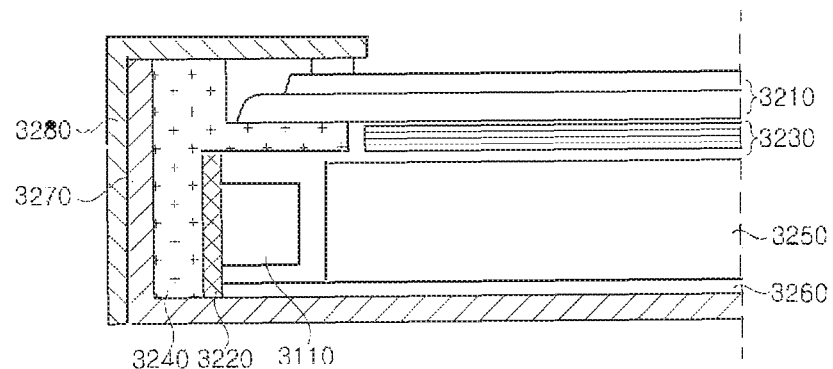
FIG. 35 is a sectional view of an exemplary display device to which a light emitting device according to exemplary embodiments of the invention is applied.

FIG. 35 is a sectional view of an exemplary display device to which a light emitting device according to exemplary embodiments of the invention is applied.

The display device according to the embodiment includes a display panel 3210 on which an image is displayed, and a backlight unit disposed at a rear side of the display panel 3210 and emitting light thereto. Further, the display device includes a frame supporting the display panel 3210 and receiving the backlight unit, and covers 3240 and 3280 surrounding the display panel 3210.

The display panel 3210 may include, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240 and 3230 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to the exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be utilized. For example, the substrate 3220 may include a printed circuit board.

The light emitting diodes 3110 may include at least one of the light emitting diodes and the light emitting devices according to the exemplary embodiments of the invention described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light. In this manner, the light emitting diodes 3110 according to the exemplary embodiment may be applied to edge type displays.

Figure 36:
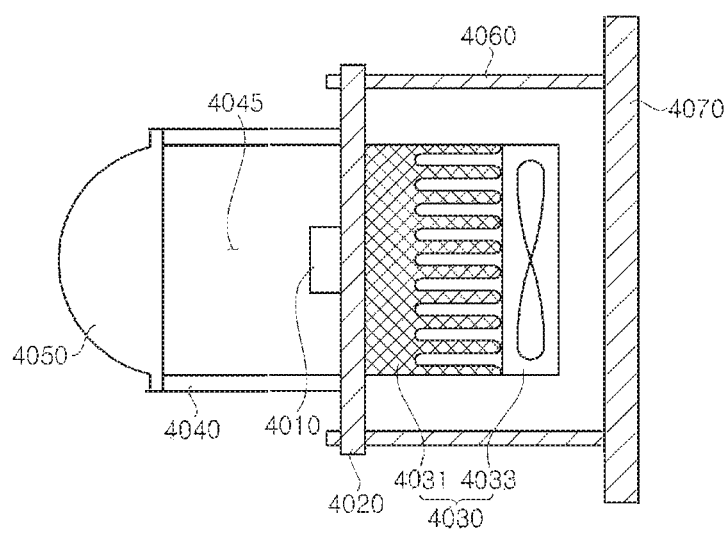
FIG. 36 is a sectional view of an exemplary headlight to which a light emitting device according to exemplary embodiments of the invention is applied.

FIG. 36 is a sectional view of an exemplary headlight to which a light emitting device according to exemplary embodiments of the invention is applied.

Referring to FIG. 36, the headlight includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 may be utilized. For example, the substrate 4020 may include a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes and the light emitting devices according to the exemplary embodiments of the invention described above.

The cover lens 4050 is disposed on a path of light emitted from the light emitting diode 4010. For example, the cover lens 4050 may be spaced apart from the light emitting diode 4010 by the connection member 4040, and may be disposed in a direction of supplying light emitted from the light emitting diode 4010. By the cover lens 4050, an orientation angle and/or a color of light emitted by the headlight may be adjusted. The connection member 4040 is disposed to secure the cover lens 4050 to the substrate 4020 while surrounding the light emitting diode 4010, and thus, may function as a light guide that provides a luminous path 4043. The connection member 4040 may include a light reflective material or coated therewith. The heat dissipation unit 4030 may include heat dissipation fins 4031 and/or a heat dissipation fan 4033, and dissipates heat generated upon operation of the light emitting diode 4010. In this manner, the light emitting diodes 4010 according to the exemplary may be applied to headlights, particularly, headlights for vehicles.

Although certain exemplary embodiments and implementations have been described herein, other embodiments and modifications will be apparent from this description. Accordingly, the inventive concept is not limited to such exemplary embodiments, but rather only by the scope of the appended claims and various modifications and equivalent arrangements apparent to the skilled artisan.

What is claimed is:

1. A light emitting device, comprising:

a light emitting structure including a first conductive type semiconductor layer on a first side of the light emitting structure, a second conductive type semiconductor layer on a second side opposing the first side of the light emitting structure, and an active layer disposed between the first conductive type semiconductor and the second conductive type semiconductor layer operable to emit light in response to an electrical current through the first and second type semiconductor layers, wherein the light emitting structure being patterned to include exposure regions of different sizes at different locations that penetrate through the second conductive type semiconductor layer and the active layer to expose the first conductive type semiconductor layer to the second side of the light emitting structure;

a first electrode formed on the second side of the first conductive type semiconductor layer to include different first electrode segments electrically connected to one another such that some of the first electrode segments are filled in the exposure regions to be electrically coupled to the first conductive type semiconductor layer to conduct the electrical current and some of the first electrode segments are on the second side of the light emitting structure;

a first electrically conductive pad electrically coupled to the first electrode to conduct the electrical current through the first conductive type semiconductor layer;

a second electrode formed on the second side of the second conductive type semiconductor layer and electrically coupled to the second conductive type semiconductor layer to conduct the electrical current through the second conductive type semiconductor layer;

a second electrically conductive pad electrically coupled to the second electrode to conduct the electrical current through the second conductive type semiconductor layer;

a first insulation layer structured to include (1) first insulation layer segments located between the first electrode and the light emitting structure and between the first and second electrodes, (2) first openings at the exposure regions of the light emitting structure to provide electrical coupling between the first electrode and the first conductive type semiconductor layer, and (3) second openings to provide electrical coupling between the second electrode and the second conductive type semiconductor layer; and a second insulation layer structured to include (1) second insulation layer segments located between the second pad and the first electrode and between the first pad and the first electrode, (2) first openings to provide electrical coupling between the second pad and the second electrode, and (3) second openings to provide electrical coupling between the first pad and the first electrode.

2. The light emitting device of claim 1, wherein:

one of the exposure regions has an elongated shape extending under a space between the first electrically conductive pad and the second electrically conductive pad.

3. The light emitting device of claim 1, wherein:

the second electrode includes Indium tin oxide (ITO) or Zinc Oxide (ZnO).

4. The light emitting device of claim 1, wherein:

the second electrode includes a reflective metal layer.

5. The light emitting device of claim 1, wherein:

one of the exposure regions is located near an edge of the light emitting structure and has a portion located inwardly from the edge of the light emitting structure.

6. The light emitting device of claim 1, wherein:
one of the exposure regions includes two opposite end portions that are located under the first electrically conductive pad and the second electrically conductive pad, respectively.

7. The light emitting device of claim 1, wherein:
each of the first electrically conductive pad and the second electrically conductive pad is structured to include electrically conductive pad regions for soldering, and
the electrically conductive pad regions are arranged to include gaps between parts of the conductive pad regions.

8. The light emitting device of claim 7, wherein:
the electrically conductive pad regions include separated conductive pad regions spaced by gaps.

9. The light emitting device of claim 7, wherein:
the electrically conductive pad regions include contiguously connected conductive pad regions having extended parts that are spaced by gaps.

10. The light emitting device of claim 1, wherein:
the first insulation layer includes $SiO_2$, $TiO_2$, or $Nb_2O_5$.

11. The light emitting device of claim 1, wherein:
the first insulation layer includes an optically reflective structure.

12. The light emitting device of claim 1, wherein:
the first insulation layer is located to cover a portion of the first conductive type semiconductor layer in an area that is located externally of the light emitting structure.

13. The light emitting device of claim 12, wherein:
a portion of the first electrode and a portion of the second insulation layer are located over the first insulation layer in the area.

14. The light emitting device of claim 12, wherein:
the first insulation layer includes a portion that covers the first conductive type semiconductor layer in the area to prevent an electrical contact between the first conductive type semiconductor layer and the first electrode in the area.

15. The light emitting device of claim 1, wherein:
the light emitting structure is patterned to as a mesa structure which has an outer side surface facing externally of an edge of the light emitting device, and the first insulation layer covers at least part of the outer side surface of the mesa structure.

16. The light emitting device of claim 15, wherein:
the first electrode includes a segment that is extended to cover the outer side surface of the mesa structure.

17. The light emitting device of claim 1, wherein:
the light emitting structure is patterned to include a mesa structure that has side surfaces that face each other, and
the first insulation layer includes a portion that covers at least part of the side surfaces of the mesa structure.

18. The light emitting device of claim 1, wherein:
the second insulation layer substantially overlaps with the first insulation layer.

19. The light emitting device of claim 1, wherein:
the light emitting structure is patterned to include a peripheral region that is exposed and is not covered by a layer;
the light emitting device includes an exterior contact region formed outside the light emitting structure that is adjacent to the peripheral region of the light emitting structure, and
the first electrode includes a portion that is in contact with the exterior contact region that is electrically coupled to the first conductive type semiconductor layer.

20. The light emitting device of claim 1, wherein:
the second insulation layer includes a portion located to cover the first conductive type semiconductor layer in an area that is located externally of the light emitting structure.

21. The light emitting device of claim 1, further comprising:
an intermediate connection layer electrically insulated from the first conductive type semiconductor layer and the first electrically conductive pad and electrically coupled to the second electrode and the second electrically conductive pad.

22. The light emitting device of claim 1, includes:
a first substrate over which the light emitting structure, the first and second electrodes, the first and second electrically conductive pads, and the first and second insulation layers are formed;
a second substrate that includes circuitry for supplying the electrical current to the light emitting structure; and
a solder contact formed between the first and second electrically conductive pads on the first substrate and the circuitry on the second substrate to provide electrical connections for the electrical current to flow from the circuitry on the second substrate to the light emitting structure on the first substrate.

23. The light emitting device of claim 22, wherein:
each of the first electrically conductive pad and the second electrically conductive pad is structured to include electrically conductive pad regions in contact with the solder contact, and
the electrically conductive pad regions are arranged to include gaps between parts of the conductive pad regions.

24. The light emitting device of claim 22, further comprising:
a wavelength conversion layer formed on a second side of the light emitting structure over the first substrate to receive light emitted from the light emitting structure to change a wavelength of the received light.

25. The light emitting device of claim 24, wherein:
the wavelength conversion layer extends to cover a side surface of the first substrate and a side surface of the first conductive type semiconductor layer.

26. The light emitting device of claim 1, wherein:
the light emitting structure includes mesa stacks protruding from the first conductive type semiconductor layer, each mesa stack separated by the exposure regions, and
the light emitting structure has an outer sidewall and an inner sidewall that face each other such that the inner sidewall is located further away from an edge of the light emitting structure than the outer sidewall, and the first insulation layer covers at least part of the inner sidewall of the mesa structure.

27. The light emitting device of claim 26, wherein:
the first insulation layer covers at least part of the outer sidewall of the mesa structure.

28. The light emitting device of claim 26, wherein:
the first electrode is extended to cover the outer sidewall of the light emitting structure.

29. The light emitting device of claim 28, wherein:
the extend first electrode is in contact with a surface of the first conductive type semiconductor layer in an area that is located externally of the light emitting structure.

30. A light emitting device, comprising;
a substrate;
a light emitting structure disposed on the substrate;
a cover located to cover the light emitting structure; and a power supply connected to the light emitting structure to regulate, change or control electric power supplied to the light emitting structure, wherein the light emitting structure comprises:

a first conductive type semiconductor layer, an active layer disposed over the first conductive type semiconductor layer, a second conductive type semiconductor layer disposed over the active layer;

a first pad electrically coupled to the first conductive type semiconductor layer;

a second pad electrically coupled to the second conductive type semiconductor layer;

a first electrode electrically coupled to the first pad and the first conductive type semiconductor layer;

a second electrode formed on the second conductive type semiconductor layer and electrically coupled to the second pad;

a first insulation layer disposed to be in contact with the first electrode; and a second insulation layer disposed to be in contact with the second pad, the second electrode and the first pad, and wherein the first electrode is electrically coupled to the first conductive type semiconductor layer through a first contact region with a relatively smaller size and a second contact region with a relatively greater size, the first contact region and the second contact region located to penetrate through the second conductive type semiconductor layer and the active layer to expose the first conductive type semiconductor layer, wherein the second contact region has an elongated shape extending under a space between the first pad and the second pad, wherein the second electrode includes Indium tin oxide (ITO) or Zinc Oxide (ZnO), wherein the second electrode further comprises a reflective metal layer.

31. The light emitting device of claim 30, wherein: the cover includes a material with light-transmitting properties.

32. The light emitting device of claim 30, comprising: a cover lens located to receive light emitted from the light emitting structure to produce an output light.

33. The light emitting device of claim 32, comprising: a connection member located between the light emitting structure and the cover lens and configured to connect the cover lens to the substrate.

34. The light emitting device of claim 33, wherein: the connection member comprises a light reflective material.

35. The light emitting device of claim 30, comprising: a heat dissipation unit located relative to the light emitting structure and configured to dissipate heat generated by the light emitting structure.

36. A display device, comprising;
a display panel that receives illumination light and process the illumination light to display images; and
a backlight unit disposed relative to the display panel and structured to produce the illumination light to the display panel, wherein the backlight unit includes light emitting devices each of which is as in claim 1.

37. The display device as in claim 36, wherein:
the light emitting devices in the backlight unit are arranged in a plane and are placed in a back side of the display panel to direct the illumination light emitted by the light emitting devices to the display panel.

38. The display device as in claim 36, comprising:
a light guide plate placed on a back side of the display panel to guide light within the light guide plate to illuminate the display panel for displaying images,
wherein the backlight unit is located at a peripheral side of the display panel and is coupled to direct light produced by the light emitting devices into the light guide plate to illuminate the display panel.

39. A display device, comprising;
a display panel that receives illumination light and process the illumination light to display images; and
a backlight unit disposed relative to the display panel and structured to produce the illumination light to the display panel, wherein the backlight unit includes light emitting devices each of which is as in claim 30.

40. The display device as in claim 39, wherein:
the light emitting devices in the backlight unit are arranged in a plane and are placed in a back side of the display panel to direct the illumination light emitted by the light emitting devices to the display panel.

41. The display device as in claim 39, comprising:
a light guide plate placed on a back side of the display panel to guide light within the light guide plate to illuminate the display panel for displaying images,
wherein the backlight unit is located at a peripheral side of the display panel and is coupled to direct light produced by the light emitting devices into the light guide plate to illuminate the display panel.

* * * * *